(12) United States Patent
Arafune et al.

(10) Patent No.: US 11,708,801 B2
(45) Date of Patent: Jul. 25, 2023

(54) LOAD DRIVE DEVICE, ENGINE SYSTEM

(71) Applicant: Hitachi Astemo, Ltd., Hitachinaka (JP)

(72) Inventors: Takuya Arafune, Hitachinaka (JP);
Takahiro Kawata, Hitachinaka (JP);
Takumi Masubuchi, Hitachinaka (JP)

(73) Assignee: Hitachi Astemo, Ltd., Hitachinaka (JP)

(*) Notice: Subject to any disclaimer, the term of this patent is extended or adjusted under 35 U.S.C. 154(b) by 117 days.

(21) Appl. No.: 17/416,911

(22) PCT Filed: Jan. 24, 2020

(86) PCT No.: PCT/JP2020/002461
§ 371 (c)(1),
(2) Date: Jun. 21, 2021

(87) PCT Pub. No.: WO2020/183934
PCT Pub. Date: Sep. 17, 2020

(65) Prior Publication Data
US 2022/0049669 A1    Feb. 17, 2022

(30) Foreign Application Priority Data

Mar. 13, 2019 (JP) .................... 2019-045674

(51) Int. Cl.
*F02D 41/20* (2006.01)
*G01R 31/52* (2020.01)
(Continued)

(52) U.S. Cl.
CPC ............ *F02D 41/20* (2013.01); *F02D 41/221* (2013.01); *G01R 31/52* (2020.01); *H03K 17/687* (2013.01);
(Continued)

(58) Field of Classification Search
CPC .................. F02D 41/20; F02D 41/221; F02D 2041/2068; F02D 2041/2086–2093; G01R 31/52; H03K 17/687
See application file for complete search history.

(56) References Cited

U.S. PATENT DOCUMENTS 10,195,991 B2 * 2/2019 Nishida ............... B60Q 11/005
2003/0197532 A1   10/2003 Tsuchida

FOREIGN PATENT DOCUMENTS

DE    102016204806 A1 * 9/2017 ........... G01R 19/165
JP    H0544538 A * 2/1993
(Continued)

OTHER PUBLICATIONS

Murakami, JP-H0544538-A, machine translation. (Year: 1993).*
(Continued)

*Primary Examiner* — Hung Q Nguyen
*Assistant Examiner* — Mark L. Greene
(74) *Attorney, Agent, or Firm* — Crowell & Moring LLP

(57) ABSTRACT

Provided is a load drive device capable of diagnosing a failure of an output terminal of the load drive device before a charging voltage stabilizes in a configuration in which a capacitor is connected to an output terminal of the load drive device that drives an inductive load. In the load drive device according to the present invention, a capacitor is connected between a load terminal and a ground terminal, and the presence or absence of a failure of the load terminal is diagnosed on the basis of a current flowing between an internal power supply included in a diagnosis circuit and the load terminal.

11 Claims, 25 Drawing Sheets

(51) Int. Cl.
F02D 41/22 (2006.01)
H03K 17/687 (2006.01)
(52) U.S. Cl.
CPC ........... *F02D 2041/2068* (2013.01); *F02D 2041/2089* (2013.01); *F02D 2041/2093* (2013.01)

(56) References Cited

FOREIGN PATENT DOCUMENTS

JP  2003-318713 A  11/2003
JP  2004-347423 A  12/2004

OTHER PUBLICATIONS

International Search Report (PCT/ISA/210) issued in PCT Application No. PCT/JP2020/002461 dated Jun. 2, 2020 with English translation (eight (8) pages).
Japanese-language Written Opinion (PCT/ISA/237) issued in PCT Application No. PCT/JP2020/002461 dated Jun. 2, 2020 (four (4) pages).

* cited by examiner

PRIOR ART

FIG. 5
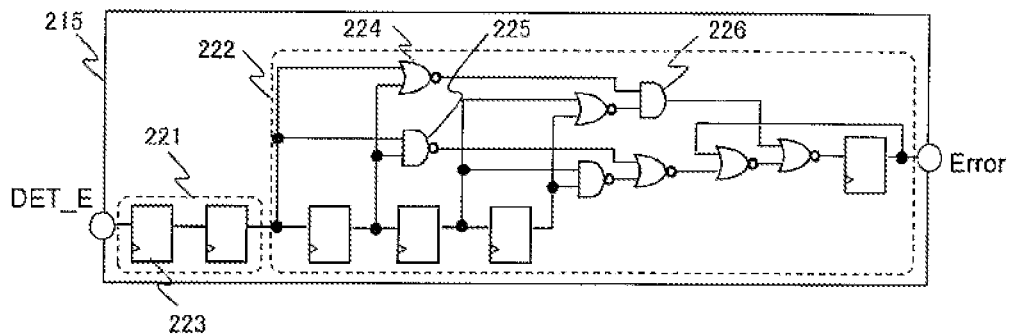
FIG. 6
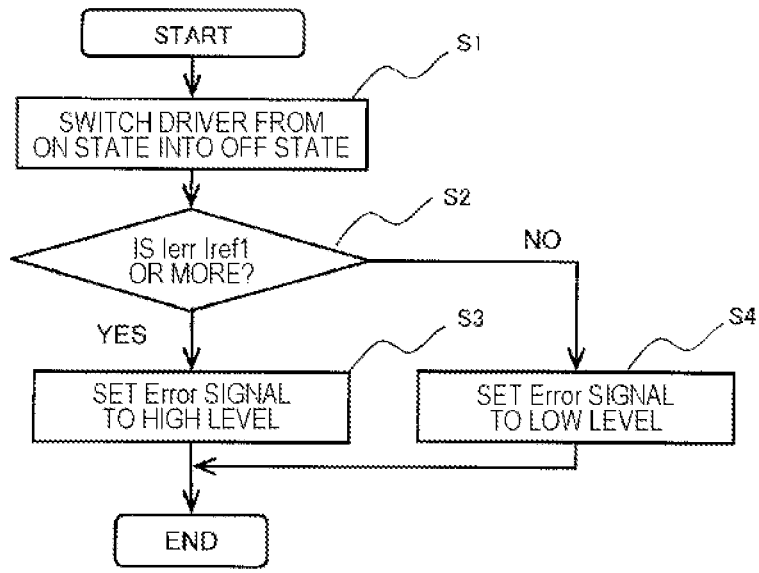
FIG. 7
| FAILURE DIAGNOSIS<br>IS Ierr Iref1 OR MORE? | FAILURE DIAGNOSIS<br>RESULT<br>(AT TIME OF OFF<br>STATE OF DRIVER) |
|---|---|
| NO | NORMAL |
| YES | FAILURE |

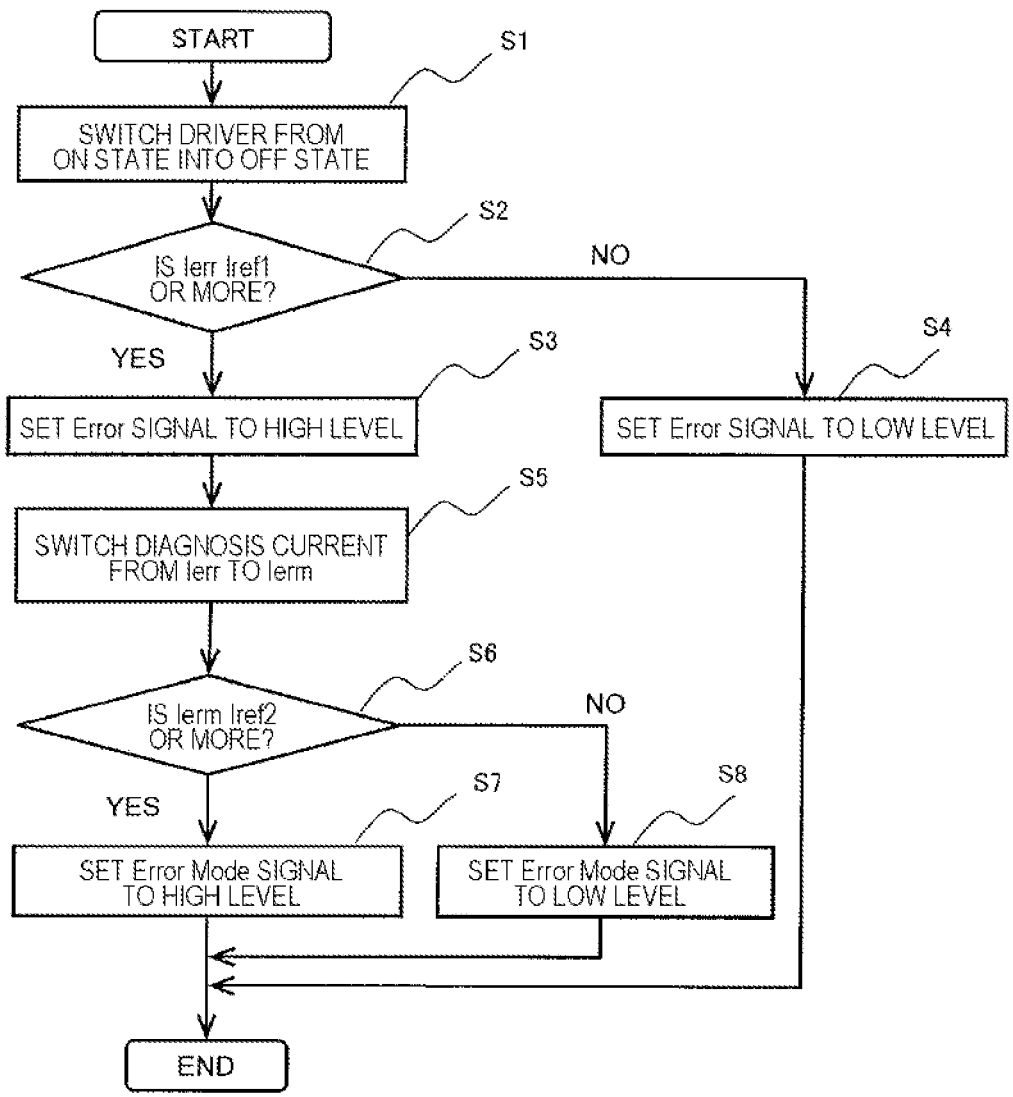

| FAILURE DIAGNOSIS | FAILURE DIAGNOSIS RESULT (AT TIME OF OFF STATE OF DRIVER) |
|---|---|
| IS Ierm Iref2 OR MORE? | |
| YES | NORMAL |
| NO | FAILURE |

FIG. 29

| OCCURRENCE PLACE | DIAGNOSIS MODE | | | DRIVER DIAGNOSIS RESULT (AT TIME OF OFF STATE OF DRIVER) |
|---|---|---|---|---|
| | FAILURE DIAGNOSIS | FAILURE MODE DIAGNOSIS | | |
| | IS Ierm Iref2 OR MORE? | IS Ierr Iref1 OR MORE? | IS Ierm Iref2 OR MORE? | |
| - | YES | - | - | NORMAL |
| IC_OUT,UNIT_OUT | NO | YES | NO | Short-to-GND |
| UNIT_OUT | NO | YES | YES | Open-Load |
| IC_OUT | NO | NO | - | Open-Load |

| FAILURE DIAGNOSIS | FAILURE MODE DIAGNOSIS | DRIVER DIAGNOSIS RESULT (AT TIME OF OFF STATE OF DRIVER) |
|---|---|---|
| IS Ierr Iref1 OR MORE? | IS Vout Vterm OR MORE? | |
| NO | - | NORMAL |
| YES | NO | Short-to-GND |
| | YES | Open-Load |

LOAD DRIVE DEVICE, ENGINE SYSTEM

TECHNICAL FIELD

The present invention relates to a load drive device that drives an inductive load composed of a drive circuit including either a low-side drive circuit or a high-side drive circuit.

BACKGROUND ART

One of roles of an electronic control unit mounted on a vehicle is fuel injection control by an injector. In order to improve reliability of the fuel injection control, a load drive device including a diagnosis circuit that diagnoses a failure at a load terminal destination in addition to a low-side drive circuit that drives the injector may be used.

PTL 1 discloses a drive device of an electrical load. PTL 1 discloses a technology in which "an electronic control unit (ECU) 10 equipped with an N-channel metal oxide semiconductor field effect transistor (MOSFET) 15 for energizing and driving a load L on a low-side includes resistors Ru and Rd each arranged between a power supply voltage VB and an output terminal 13 (a drain of the N-channel MOSFET 15) and between the output terminal 13 and a ground, and resistance values of the resistors Ru and Rd are set so that a voltage VO of the output terminal 13 at the time of turning off the N-channel MOSFET 15 becomes VB/2 at the time of a disconnection failure of the load L and becomes approximately VB at a normal time. Then, each of determination voltages Vth1 (>VB/2) and Vth2 (<VB/2) is compared with the voltage VO by comparators 21 and 22, it is determined that a disconnection failure occurs if Vth1≥VO>Vth2 and it is determined that a ground short-circuit occurs if Vth2≥VO at the time of turning off the N-channel MOSFET 15, and fail-safe processing having different contents at the time of each failure detection is performed." "in order to discriminatingly detect a disconnection failure of an electrical load and a ground short-circuit at the time of turning off a driving switching means in an electronic control device of a low-side drive form" (See Abstract).

CITATION LIST

Patent Literature

PTL 1: JP 2004-347423 A

SUMMARY OF INVENTION

Technical Problem

The electronic control unit mounted on the vehicle is required to have a function of detecting a failure at each terminal. Examples of detection targets include (a) normal, (b) an Open-Load failure, (c) a ground short-circuit failure (hereinafter, referred to as a Short-to-GND failure), (d) a battery short-circuit failure (hereinafter, referred to as a Short-to-VB failure), and the like.

Meanwhile, an output terminal of the electronic control unit is required to have resistance to noise or surge from the outside of the electronic control unit, such as electrostatic discharge (ESD) or the like. This can be realized by, for example, connecting a capacitor between the output terminal of the electronic control unit and a ground. However, in this case, a charging current flows to the capacitor, and thus, it takes some time for a charging voltage to stabilize.

In a method of determining the Open-Load failure or the Short-to-GND failure by comparing the output voltage VO with the determination threshold as in PTL 1, it is difficult to diagnose the Open-Load failure or the Short-to-GND failure until the charging voltage of the capacitor stabilizes. The reason is that because the capacitor is connected to the output terminal, the output voltage VO also does not stabilize until the charging voltage stabilizes.

The present invention has been made in view of the above problem, and provides a load drive device capable of diagnosing a failure of an output terminal of the load drive device before a charging voltage stabilizes in a configuration in which a capacitor is connected to an output terminal of the load drive device that drives an inductive load.

Solution to Problem

In a load drive device according to the present invention, a capacitor is connected between a load terminal and a ground terminal, and the presence or absence of a failure of the load terminal is diagnosed on the basis of a current flowing between an internal power supply included in a diagnosis circuit and the load terminal.

Advantageous Effects of Invention

According to the load drive device according to the present invention, in a configuration in which a capacitor is connected between the load terminal and the ground terminal, a state (normal, an Open-Load failure, or a Short-to-GND failure) of the load terminal can be more quickly and accurately detected by performing a diagnose before completion of charging of the capacitor. Objects, configurations, and effects other than those described above will be clarified from a description of embodiments provided below.

BRIEF DESCRIPTION OF DRAWINGS

FIG. 5 illustrates an example of a filter circuit 215.

FIG. 6 is a flowchart for describing a procedure in which the load drive device 100 illustrated in FIG. 3 diagnoses UNIT_OUT.

FIG. 7 is a correspondence table of a diagnosis result by a diagnosis flow of FIG. 6.

FIG. 12 is a flowchart for describing a procedure in which the load drive device 100 according to the second embodiment diagnoses UNIT_OUT.

FIG. 13 is a correspondence table of a diagnosis result by a diagnosis flow of FIG. 12.

FIG. 29 illustrates a correspondence table between a failure detection current and a diagnosis result.

DESCRIPTION OF EMBODIMENTS

<Conventional Load Drive Device>

Figure 1:
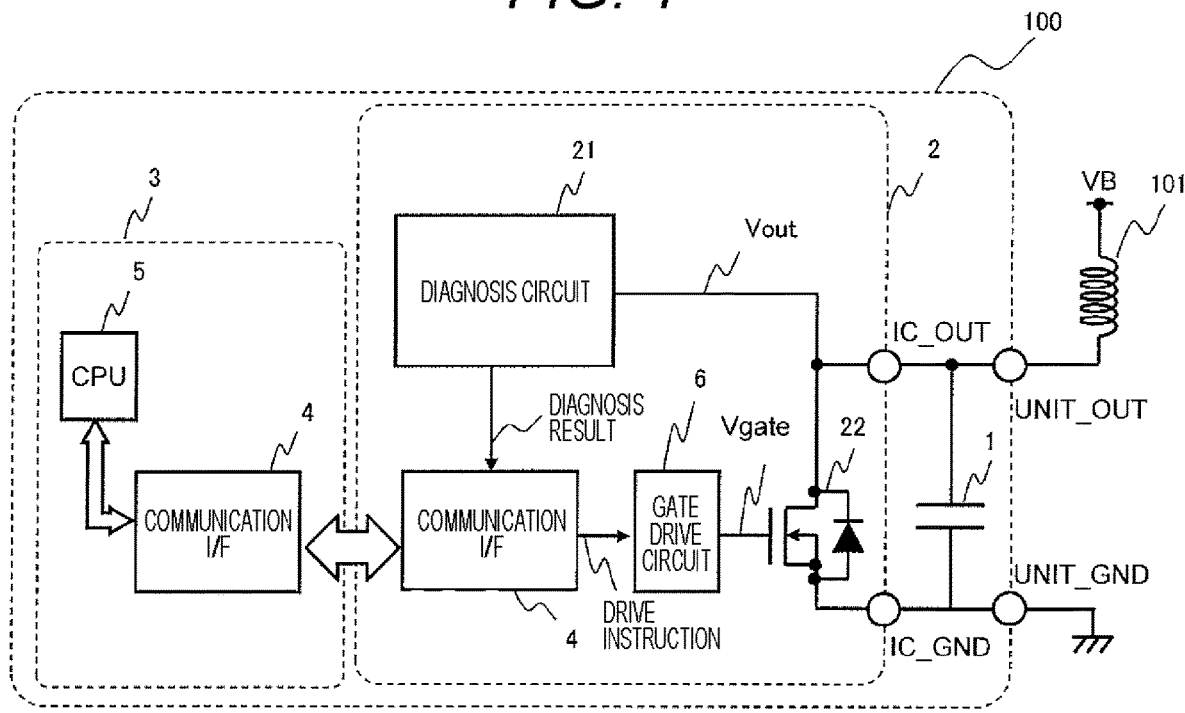
FIG. 1 illustrates an entire configuration example of a conventional load drive circuit including a diagnosis circuit.

FIG. 1 illustrates an entire configuration example of a conventional load drive circuit including a diagnosis circuit. A load drive device 100 includes a drive circuit 2 for driving an injector 101. The drive circuit 2 includes a gate drive circuit 6, a diagnosis circuit 21, a low-side drive circuit 22, and a communication interface (I/F) 4. The gate drive circuit 6 outputs a drive signal Vgate according to a drive instruction from a central processing unit (CPU) 5 included in a microcontroller 3. The low-side drive circuit 22 is turned on when the drive signal Vgate from the gate drive circuit 6 is at a high level, and is turned off when the drive signal Vgate is at a low level. The diagnosis circuit 21 diagnoses UNIT_OUT, which is an output terminal of a unit. The communication interface 4 performs data communication between the drive circuit 2 and the microcontroller 3. A diagnosis result is read by the CPU 5 via the communication interface 4, and the CPU 5 performs control according to the diagnosis result.

Figure 2:
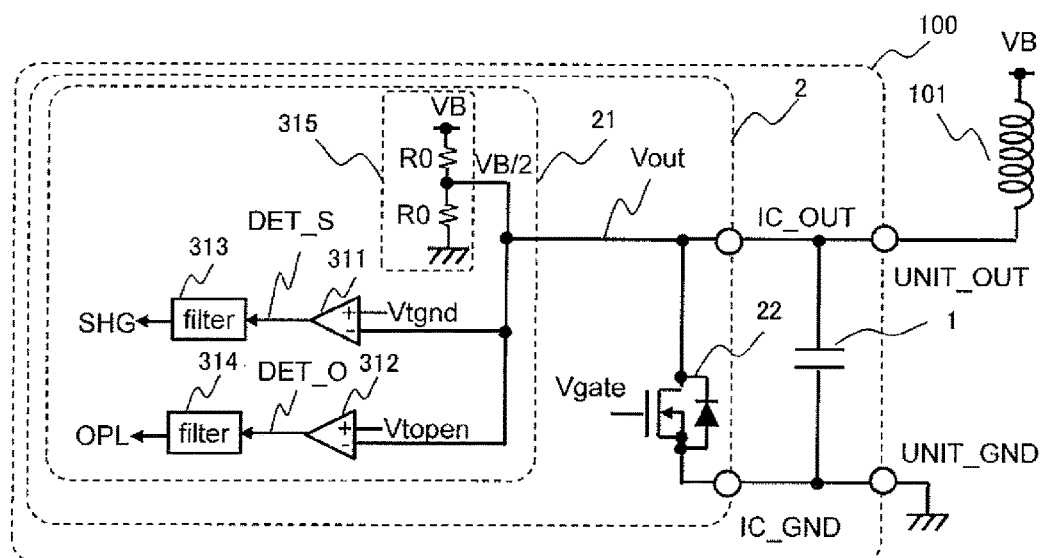
FIG. 2 illustrates an example of a load drive circuit that diagnoses a failure of IC_OUT based on a voltage value of Vout.

FIG. 2 illustrates an example of a load drive circuit that diagnoses a failure of IC_OUT based on a voltage value of Vout. Here, the same configuration example as that of PTL 1 has been illustrated. The diagnosis circuit 21 includes a voltage dividing circuit 315 and voltage comparison circuits 311 and 312. The voltage dividing circuit 315 applies an intermediate voltage VB/2 obtained by dividing a first power supply voltage VB by a resistor R0, to IC_OUT, which is an output terminal of the drive circuit. The voltage comparison circuits 311 and 312 compare Vout with each diagnosis threshold. The voltage dividing circuit 315 is configured so that a potential Vout during a period in which the low-side drive circuit 22 is in an off state becomes (a) an intermediate voltage VB/2 at the time of an open failure that a connection with the injector 101, which is a load, is open (hereinafter referred to as an Open-Load failure), and becomes (b) the first power supply voltage VB at a normal time. The voltage comparison circuits 311 and 312 perform a failure diagnosis by comparing Vout with the diagnosis thresholds. Because a drive target of the drive circuit 2 is the injector 101, the load drive device 100 is a load drive device that drives an inductive load.

When the drive circuit 2 is driving the injector 101, if an Open-Load failure occurs at the output terminal UNIT_OUT of the load drive device 100, the injector 101 cannot inject a fuel, resulting in a misfire failure, which may damage an engine. It is necessary to detect a failure and perform appropriate control in order to prevent the damage to the engine. In recent years, in the injector 101, a drive cycle of the low-side drive circuit 22 becomes short due to multi-stage injection control for reducing exhaust gas, such that it is necessary to determine an Open-Load failure and a Short-to-GND failure at a higher speed.

In FIG. 2, (a) in a case where Vout<Vtgnd, it can be determined that the Short-to-GND failure has occurred at the output terminal UNIT_OUT, (b) in a case where Vtgnd<Vout<Vtopen, it can be determined that the Open-Load failure has occurred at the output terminal UNIT_OUT, and (c) in a case where Vtopen<Vout, it can be determined that the output terminal UNIT_OUT is normal. The intermediate voltage VB/2 is a voltage value that satisfies Vtgnd<VB/2<Vtopen.

Meanwhile, the UNIT_OUT terminal mounted on the vehicle is required to have resistance to noise or surge from the outside of the unit, such as electrostatic discharge (ESD) or the like. In a case where the IC_OUT of the drive circuit 2 is connected to UNIT_OUT of the load drive device 100, a capacitor 1 is provided outside the drive circuit 2 and inside the load drive device 100 in order to protect the drive circuit 2 from the noise or the surge. If the capacitor 1 is provided as an ESD countermeasure, a charging current flows according to a certain time constant, such that responsiveness of a charging voltage of the capacitor 1 is deteriorated and it takes time for the charging voltage to stabilize.

In a method of discriminating between the Open-Load failure and the Short-to-GND failure on the basis of Vout during the period in which the low-side drive circuit 22 is in an off state, it is difficult to diagnose the Open-Load failure or the Short-to-GND failure until the charging voltage stabilizes, and it is thus necessary to diagnose the Open-Load failure or the Short-to-GND failure by a voltage after charging of the capacitor is completed. However, in the multi-stage injection control in which a drive cycle is short, the charging does not end within the drive cycle, and it becomes thus difficult to discriminate between the failures.

First Embodiment

In a first embodiment of the present invention, a configuration and an operation of a load drive device 100 capable of detecting whether a UNIT_OUT terminal is normal or fails even in a case where a capacitor 1 is connected between an output terminal and a ground terminal as a disturbance noise or surge countermeasure inside the load drive device 100 that drives an inductive load will be described. However, in the first embodiment, it is assumed that an Open-Load failure of an IC_OUT terminal can be ignored. Therefore, an Open-Load failure in the first embodiment refers to an Open-Load failure occurring at the UNIT_OUT terminal.

Figure 3:
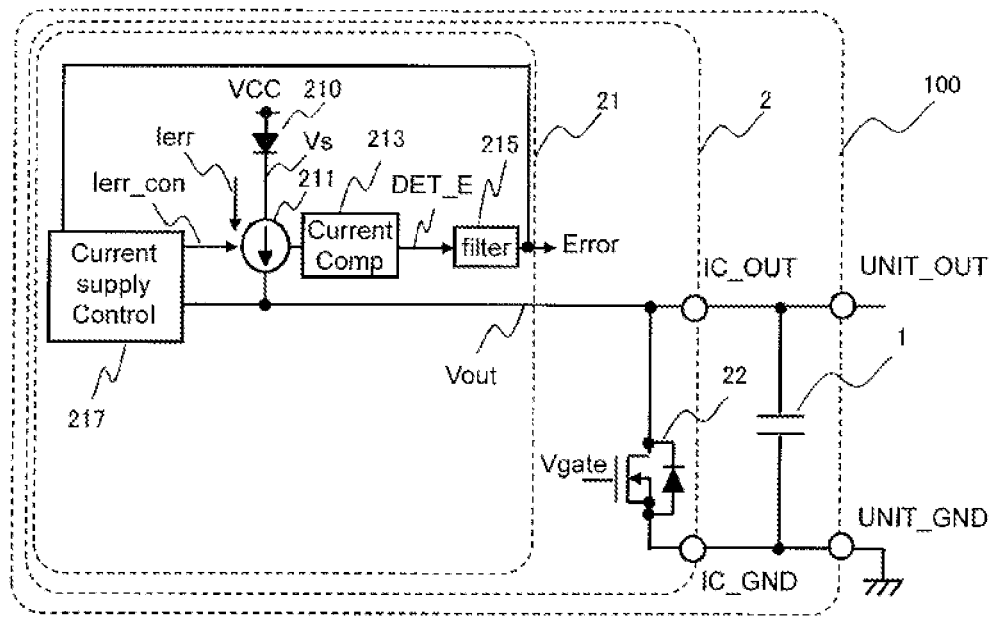
FIG. 3 is a block diagram illustrating a configuration of a load drive device 100 according to a first embodiment.

FIG. 3 is a block diagram illustrating a configuration of the load drive device 100 according to the first embodiment. The load drive device 100 illustrated in FIG. 3 includes a capacitor 1, a low-side drive circuit 22, and a diagnosis circuit 21. The low-side drive circuit 22 and the capacitor 1 are connected in parallel between an output terminal and a ground terminal. The diagnosis circuit 21 includes a first constant current source 211, a current comparison circuit 213, a filter circuit 215, a constant current source control circuit 217, and a reverse current prevention diode 210.

The first constant current source 211 makes a current Ierr flow from a second power supply voltage VCC to the IC_OUT terminal. The current comparison circuit 213 monitors a drive current of the first constant current source 211. The filter circuit 215 takes a drive current detection signal DET_E, which is an output of the current comparison circuit 213, as an input.

The constant current source control circuit 217 outputs a constant current source control signal Ierr_con, which is a drive signal of the first constant current source 211. The reverse current prevention diode 210 is connected between the second power supply voltage VCC and the first constant current source 211. A reverse current prevention means is only required to be arranged between VCC and IC_OUT, and the reverse current prevention diode 210 has been provided between VCC and the first constant current source 211 as an example in FIG. 3.

The current comparison circuit 213 outputs a high level when the detected drive current is larger than a threshold current Iref1 to be described later. In order for the first constant current source 211 to make the drive current Ierr flow from the second power supply voltage VCC to IC_OUT (output potential Vout), it is necessary to satisfy at least Equation 1: Vout<VCC. When this condition is satisfied, a diagnosis by the current comparison circuit 213 is performed.

Figure 4:
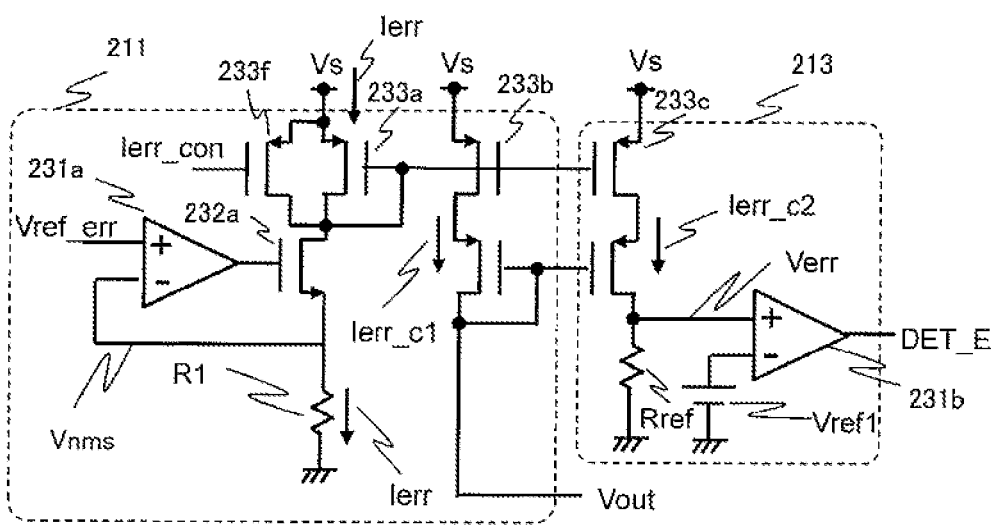
FIG. 4 illustrates a configuration example of a first constant current source 211 and a current comparison circuit 213.

FIG. 4 illustrates a configuration example of the first constant current source 211 and the current comparison circuit 213. The first constant current source 211 includes an operational amplifier 231a, a resistor R1, an N-channel metal oxide semiconductor (NMOS) 232, and a P-channel MOS (PMOS) 233. The first constant current source 211 takes Ierr_con as an input, and makes the current Ierr according to a voltage Vref_err flow when Ierr_con is at a high level. Ierr_c1 and Ierr_c2, which are copy currents of the current Ierr, are made to flow to the output terminal and the current comparison circuit 213, respectively, by a current mirror composed of PMOSs 233a, 233b, and 233c.

Two inputs of the operational amplifier 231a are virtually short-circuited, such that Vnms, which is a source potential of an NMOS 232a, becomes the same potential as Vref_err, and Ierr can thus be expressed by Vref_err/R1. That is, Ierr can be adjusted depending on Vref_err. When Ierr_con is at a low level, a PMOS 233f is turned on, such that a potential is not generated across the PMOS 233a, and thus, a current does not flow in the PMOS 233a.

The current comparison circuit 213 includes a PMOS 233, a resistor Rref, an operational amplifier 231b, and a reference power supply Vref1. Ierr_c2 is converted into a voltage by Rref, and the converted voltage is compared with Vref1, which is a detection threshold. Vref1 is a voltage value when a current Iref1 flows to Rref. In a case where Ierr_c2 is larger than Iref1, Verr becomes larger than Vref1, such that the operational amplifier 231b sets DET_E, a failure detection signal, to a high level. In a case where Ierr_c2 is smaller than Iref1, Verr becomes smaller than Vref1, such that the operational amplifier 231b sets DET_E to a low level.

FIG. 5 illustrates an example of the filter circuit 215. The filter circuit 215 includes an input synchronization unit 221 by a clock and a glitch filter 222. The filter circuit 215 receives DET_E, which is an output of the current comparison circuit 213, as an input signal. The filter circuit 215 includes logic circuits such as a flip-flop 223, a NOR circuit 224, a NAND circuit 225, and an AND circuit 226 that operate by clocks, and outputs an error signal.

The glitch filter outputs a high level only in a case where current and previous N samples are at a high level and outputs a low level only in a case where current and previous N samples are at a low level, and an output of the glitch filter does not change from a current value otherwise. FIG. 5 illustrates a case where N=4. In order to remove asynchronous glitches or chattering in DET_E, the filter circuit 215 can remove glitches less than a filter time and pass signals of the filter time or more to pass therethrough.

FIG. 6 is a flowchart for describing a procedure in which the load drive device 100 illustrated in FIG. 3 diagnoses UNIT_OUT. The present flowchart is performed by each functional unit of the load drive device 100 at a timing of switching the low-side drive circuit 22 from an on state to an off state. Each step of FIG. 6 will be described below.

S1: The gate drive circuit 6 changes the drive signal Vgate of the low-side drive circuit 22 from a high level to a low level according to an instruction from the CPU 5. As a result, the low-side drive circuit 22 is switched from the on state to the off state.

S2: The current comparison circuit 213 determines whether or not a drive current flowing to the first constant current source 211 is Iref1 or more at a point in time when tfil1, which is a filter time of failure detection, has elapsed since the low-side drive circuit 22 was turned off. In a case where the drive current flowing to the first constant current source 211 is Iref1 or more, the processing proceeds to S3, and in a case where the drive current flowing to the first constant current source 211 is less than Iref1, the processing proceeds to S4.

S3: The current comparison circuit 213 sets an error signal, which is a failure detection signal, to a high level, and ends the processing.

S4: The current comparison circuit 213 sets the error signal, which is the failure detection signal, to a low level, and ends the processing.

FIG. 7 is a correspondence table of a diagnosis result by a diagnosis flow of FIG. 6. If the low-side drive circuit 22 is in the off state and the drive current Ierr flowing to the first constant current source 211 is Iref1 or more, it is diagnosed that a failure has occurred at UNIT_OUT. If the low-side drive circuit 22 is in the off state and the drive current Ierr flowing to the first constant current source 211 is less than Iref1, it is diagnosed that UNIT_OUT is normal.

Figure 8:
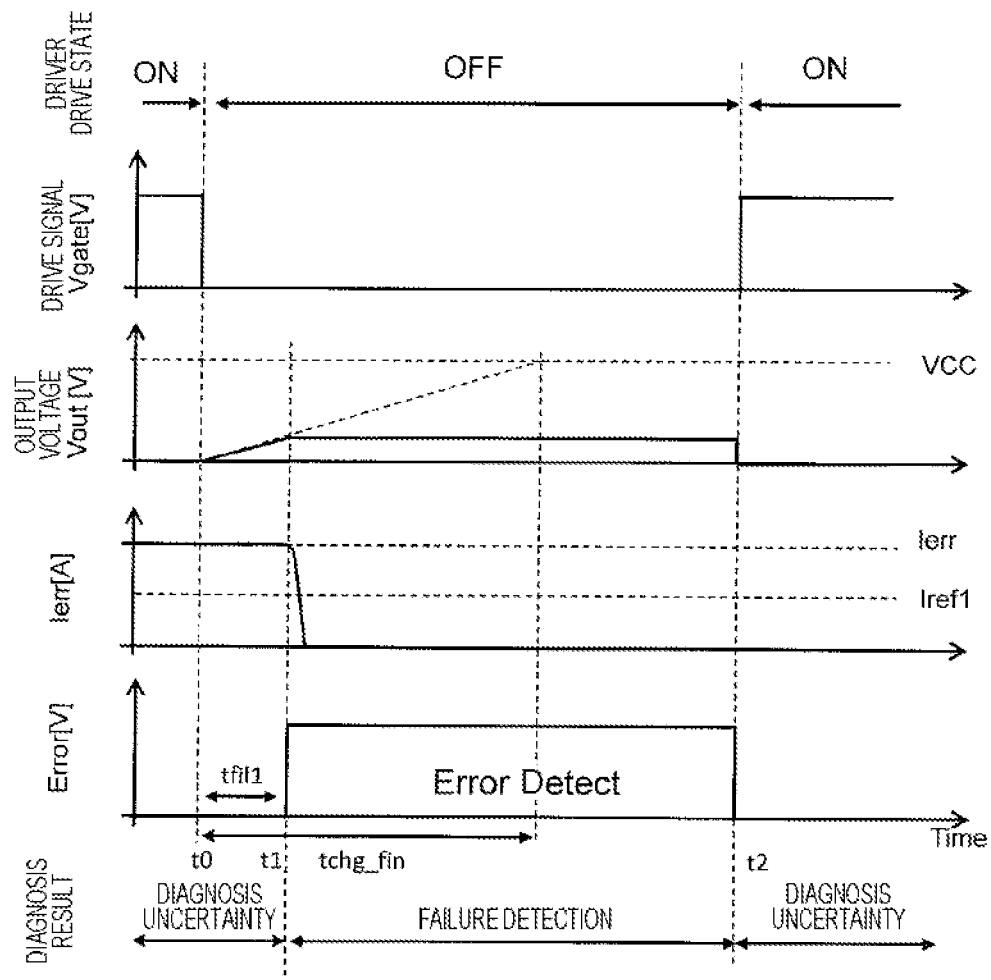
FIG. 8 is a timing chart for describing behavior of signals in each load state.

FIG. 8 is a timing chart for describing behavior of signals in each load state. Here, a circuit operation in a case where an Open-Load failure occurs at UNIT_OUT of the load drive device 100 illustrated in FIG. 3 will be described.

In a case where the Open-Load failure occurs at UNIT_OUT, the capacitor 1 after the low-side drive circuit 22 is turned off (t0) has no electric charge, such that the potential Vout is a ground potential and Vgnd=Vout<VCC. Because this satisfies Equation 1, Ierr becomes Iref1 or more, such that DET_E becomes the high level. If DET_E is at the high level continuously for a time of tfil1 or more, it is determined that the failure has occurred. It is assumed that tfil1 is a time shorter than tchg_fin, which is a time required to complete charging of the capacitor.

In a case where the short-to-GND failure occurs at UNIT_OUT, Vout is connected to the ground potential Vgnd, such that Vgnd=Vout<VCC. Because this satisfies Equation 1, Ierr becomes Iref1 or more, such that DET_E becomes the high level. If DET_E is at the high level continuously for a time of tfil1 or more, it is determined that the failure has occurred.

In a case of a normal operation, Vout is connected to the first power supply voltage VB via a load, such that VCC<Vout (=VB). Because this does not satisfy Equation 1, Ierr becomes less than Iref1, such that DET_E becomes the low level. If DET_E is at the low level continuously for a time of tfil1 or more, it is diagnosed that UNIT_OUT is normal. It is assumed that the second power supply voltage VCC is a voltage smaller than the first power supply voltage VB.

First Embodiment: Summary

In the load drive device 100 according to the first embodiment, the capacitor 1 is connected between the output terminal UNIT_OUT and the ground terminal UNIT_GND of the load drive device 100 that drives the inductive load (injector 101). The diagnosis circuit 21 can detect a state of the UNIT_OUT terminal more rapidly and more accurately than a conventional manner by diagnosing UNIT_OUT using the drive current Ierr of the first constant current source 211 before a charging voltage of the capacitor 1 stabilizes, and can thus improve reliability.

Second Embodiment

In a second embodiment of the present invention, in addition to the failure diagnosis in the first embodiment, what kind of failure has occurred (failure mode) is diagnosed. That is, a configuration and an operation for detecting a state (any one of normal, an Open-Load failure, and a Short-to-GND failure) of a load will be described. However, portions changed from the first embodiment will hereinafter be mainly described with reference to FIGS. 3 to 8 as appropriate.

Figure 9:
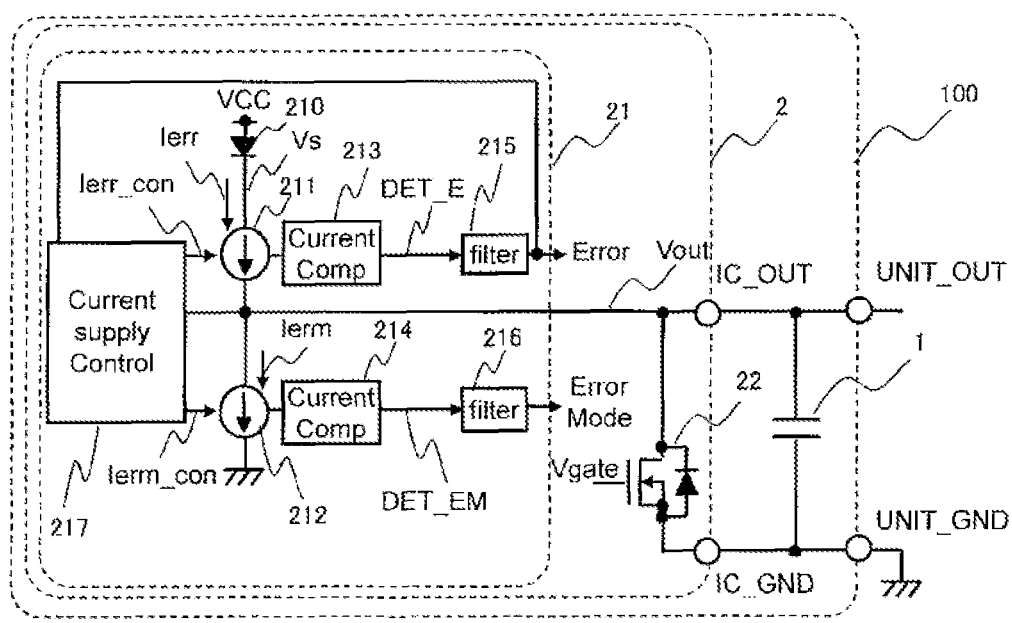
FIG. 9 is a block diagram illustrating a configuration of a load drive device 100 according to a second embodiment.

FIG. 9 is a block diagram illustrating a configuration of a load drive device 100 according to the second embodiment. A diagnosis circuit 21 illustrated in FIG. 9 includes a second constant current source 212, a current comparison circuit 214, and a filter circuit 216, in addition to the configuration described in the first embodiment.

The second constant current source 212 makes a current Ierm flow from an IC_OUT terminal to a ground. The current comparison circuit 214 monitors a drive current Ierm of the second constant current source 212. The filter circuit 216 takes a drive current detection signal DET_EM, which is an output of the current comparison circuit 214, as an input.

The constant current source control circuit 217 outputs Ierr_con that controls the second constant current source 212 in addition to Ierr_con that controls the first constant current source 211. In order for the second constant current source 212 to make the drive current Ierm flow from IC_OUT to the ground, it is necessary to satisfy at least Vgnd<Vout (Equation 2). When this condition is satisfied, a diagnosis by the current comparison circuit 214 is performed.

Figure 10:
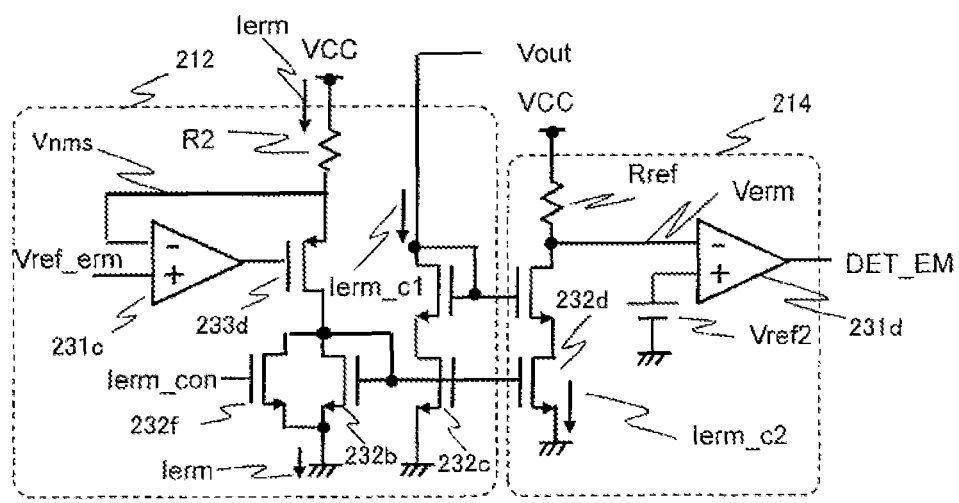
FIG. 10 illustrates a configuration example of a second constant current source 212 and a current comparison circuit 214.

FIG. 10 illustrates a configuration example of the second constant current source 212 and the current comparison circuit 214. The second constant current source 212 includes an operational amplifier 231c, a resistor R2, an NMOS 232, and a PMOS 233. The second constant current source 212 takes Ierm_con as an input, and when Ierm_con is at a low level, an NMOS 232f is turned off to make a current Ierm according to a voltage Vref_erm flow. Ierm_c1 and Ierm_c2, which are copies of Ierm, are made to flow to the output terminal and the current comparison circuit 214, respectively, by a current mirror composed of NMOSs 232b, 232c, and 232d.

Two inputs of the operational amplifier 231c are virtually short-circuited, such that Vnms, which is a source potential of an NMOS 233d, becomes the same potential as Vref_erm, and Ierm can thus be expressed by (VCC−Vref_erm)/R2. That is, Ierm can be adjusted depending on a potential of Vref_erm. When Ierm_con is at a high level, the NMOS 232f is turned on, such that a potential is not generated across the NMOS 232b, and thus, a current does not flow in the NMOS 232b.

The current comparison circuit 214 includes an NMOS 232, a resistor Rref, an operational amplifier 231d, and a reference power supply Vref2. Ierm_c2 is converted into a voltage by Rref, and the converted voltage is compared with Vref2, which is a detection threshold. Vref2 is a voltage value when a current Iref2 flows to Rref. In a case where Ierm_c2 is larger than Iref2, Verm is larger than Vref2, such that the operational amplifier 231d sets DET_EM, which is a failure mode discrimination signal, to a high level. In a case where Ierm_c2 is smaller than Iref2, Verm becomes smaller than Vref2, such that the operational amplifier 231d sets DET_EM to a low level.

Figure 11:
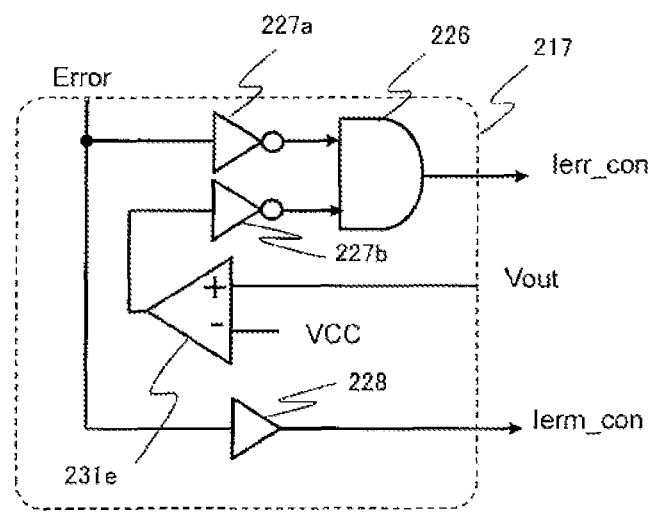
FIG. 11 illustrates a configuration example of a constant current source control circuit 217 according to the second embodiment.

FIG. 11 illustrates a configuration example of the constant current source control circuit 217 according to the second embodiment. The constant current source control circuit 217 takes a failure detection signal Error as an input, and outputs Ierr_con and Ierm_con. When the error signal is at a low level and Vout is less than VCC, Ierr_con is set to a high level. If the error signal becomes a high level, a driven constant current source is switched from the first constant current source 211 to the second constant current source 212 by setting Ierr_con to a low level and setting Ierm_con to a high level via a buffer circuit 228.

FIG. 12 is a flowchart for describing a procedure in which the load drive device 100 according to the second embodiment diagnoses UNIT_OUT. Only steps changed from the diagnosis flow in the first embodiment described in FIG. 6 are illustrated below.

S3: The current comparison circuit 213 sets an error signal, which is a failure detection signal, to a high level.

S5: The error signal is input to the constant current source control circuit 217. The constant current source control circuit 217 turns off the first constant current source 211 and turns on the second constant current source 212 by setting Ierr_con that controls the first constant current source 211 to a low level and setting Ierm_con that controls the second constant current source 212 to a high level.

S6: The current comparison circuit 214 determines whether or not the drive current Ierm flowing to the second constant current source 212 is Iref2 or more at a point in time when tfil2, which is a filter time of the filter circuit 216, has elapsed since the drive of the second constant current source 212 was started. In a case where the drive current Ierm flowing to the second constant current source 212 is Iref2 or more, the processing proceeds to S7, and in a case where the drive current Ierm flowing to the second constant current source 212 is less than Iref2, the processing proceeds to S8.

S7: The current comparison circuit 214 sets an error mode signal, which is a failure mode discrimination signal, to a high level, and ends the processing.

S8: The current comparison circuit 214 sets the error mode signal to a low level, and ends the processing.

FIG. 13 is a correspondence table of a diagnosis result by a diagnosis flow of FIG. 12. If the low-side drive circuit 22 is in the off state, the drive current Ierr flowing to the first constant current source 211 is Iref1 or more, and the drive current Ierm flowing to the second constant current source 212 is less than Iref2, it is diagnosed that a ground short-circuit failure has occurred at UNIT_OUT. If the low-side drive circuit 22 is in the off state, the drive current Ierr flowing to the first constant current source 211 is Iref1 or more, and the drive current Ierm flowing to the second constant current source 212 is Iref2 or more, it is diagnosed that an open failure has occurred at UNIT_OUT. If the low-side drive circuit 22 is in the off state and the drive current Ierr flowing to the first constant current source 211 is less than Iref1, it is diagnosed that UNIT_OUT is normal.

Figure 14:
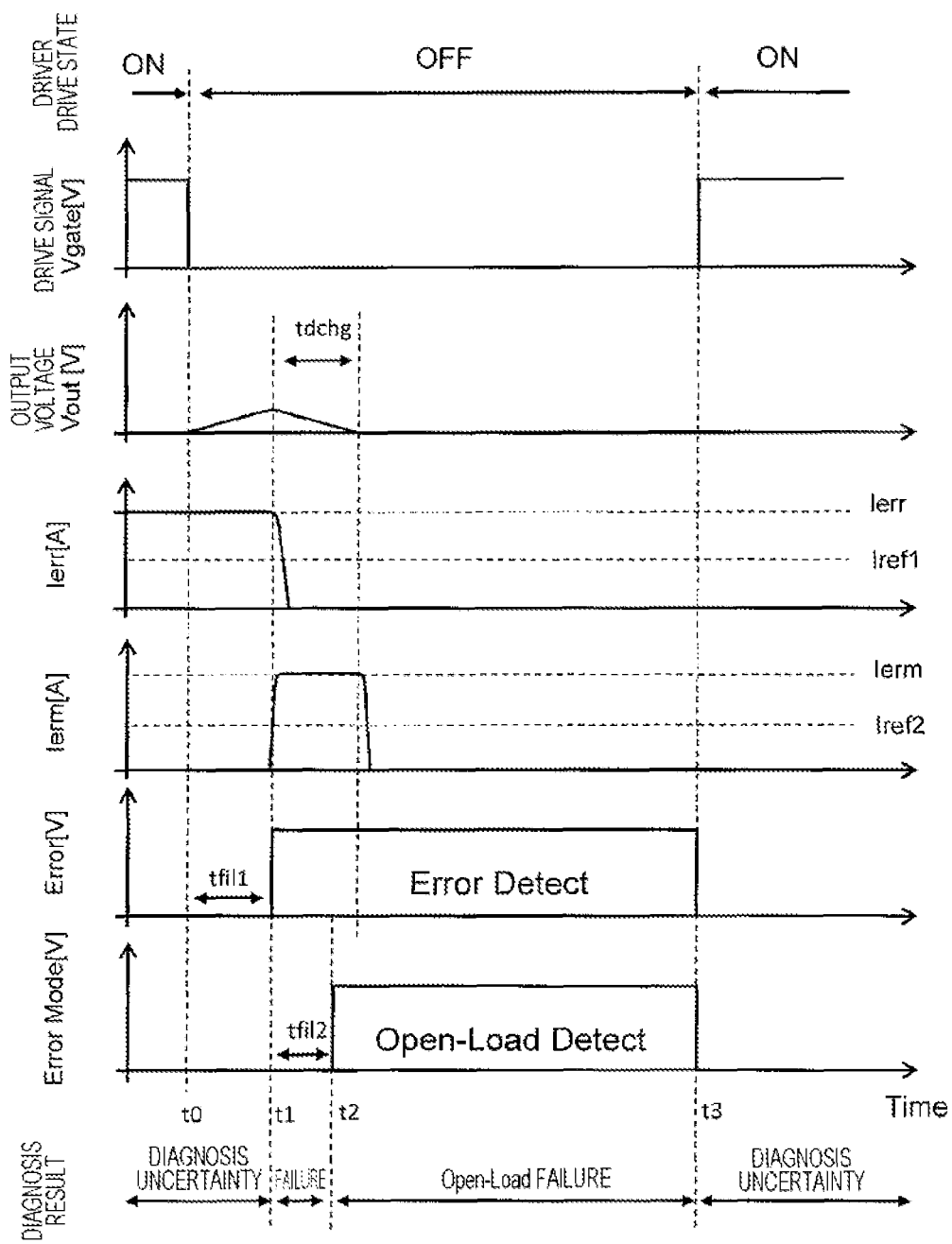
FIG. 14 is a timing chart for describing behavior of signals in each load state.

FIG. 14 is a timing chart for describing behavior of signals in each load state. Here, a circuit operation in a case where an Open-Load failure has occurred at UNIT_OUT in FIG. 12 will be described.

In a case where the Open-Load failure has occurred at UNIT_OUT, Equation 1 is satisfied, and thus, the diagnosis circuit 21 outputs the error signal at the high level. As a result, the constant current source control circuit 217 switches a diagnosis current from the failure detection current Ierr to the failure mode discrimination current Ierm. When the Open-Load failure has occurred at UNIT_OUT, Ierr is charged in the capacitor 1, and the potential Vout after the time tfil1 can be expressed as Vgnd<Vout (=Ierr×tfil1/C1) using a capacitance value C1 of the capacitor 1. If the second constant current source 212 is driven after tfil1 has elapsed, electric charges accumulated in the capacitor 1 are discharged via the second constant current source 212, and Ierm of Iref2 or more flows only during a discharge time tdchg. Therefore, DET_EM becomes a high level during this period. By setting tfil2 shorter than tdchg of the capacitor 1, Ierm can be detected, and the Open-Load failure can thus be determined.

In a case where the Short-to-GND failure has occurred, Equation 1 is satisfied, and thus, the diagnosis circuit 21 outputs the error signal at the high level. As a result, the constant current source control circuit 217 switches the diagnosis current from Ierr to Ierm. Meanwhile, because UNIT_OUT is short-circuited to the ground, Equation 2 is not satisfied, and the current Ierm becomes smaller than Iref2, such that DET_EM becomes a low level. If DET_EM is at the low level continuously for a time of tfil2 or more, it is determined that the Short-to-GND failure has occurred.

Second Embodiment: Summary

The load drive device 100 according to the second embodiment further diagnoses a failure mode on the basis of Ierm when it detects a failure occurrence on the basis of Ierr, in addition to the configuration described in the first embodiment.

Therefore, UNIT_OUT can be diagnosed at a high speed, similar to the first embodiment, and the failure mode can be determined at a high speed.

Third Embodiment

In a third embodiment of the present invention, a configuration example in which a constant current source control circuit 217 controls current values of each of Ierr and Ierm will be described. As a result, an optimum diagnosis current can be selected according to constraints such as a capacitance value or a consumed current of the capacitor 1. Portions changed from the second embodiment will hereinafter be mainly described with reference to FIGS. 9 to 14 of the second embodiment as appropriate.

Figure 15:
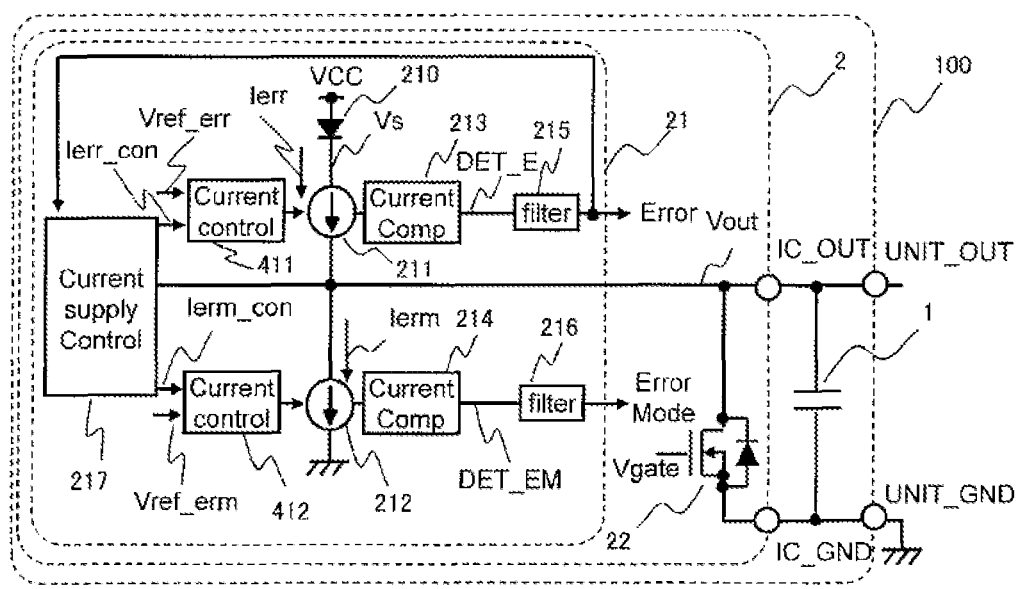
FIG. 15 is a block diagram illustrating a configuration of a load drive device 100 according to a third embodiment.

FIG. 15 is a block diagram illustrating a configuration of a load drive device 100 according to the third embodiment. A diagnosis circuit 21 illustrated in FIG. 15 includes drive current control circuits 411 and 412. The drive current control circuit 411 receives a constant current source control signal Ierr_con and a drive current control signal Vref_err as inputs, and controls a current value of Ierr on the basis of Ierr_con and Vref_err. The drive current control circuit 412 receives a constant current source control signal Ierm_con and a drive current control signal Vref_erm as inputs, and controls a current value of Ierm on the basis of Ierm_con and Vref_erm.

The drive current control circuits 411 and 412 output a low level when an output of the constant current source control circuit 217 is at a low level, and make currents Ierr and Ierm according to a magnitude of the drive current control signal Vref_err or Vref_erm flow when the output of the constant current source control circuit 217 is at a high level. As an example, a circuit configuration such as the first constant current source 211 of FIG. 4 or the second constant current source 212 of FIG. 10 can be used. According to these constant current sources, magnitudes of Ierr and Ierm can be variably controlled by controlling voltages of Vref_err and Vref_erm, respectively.

Figure 16:
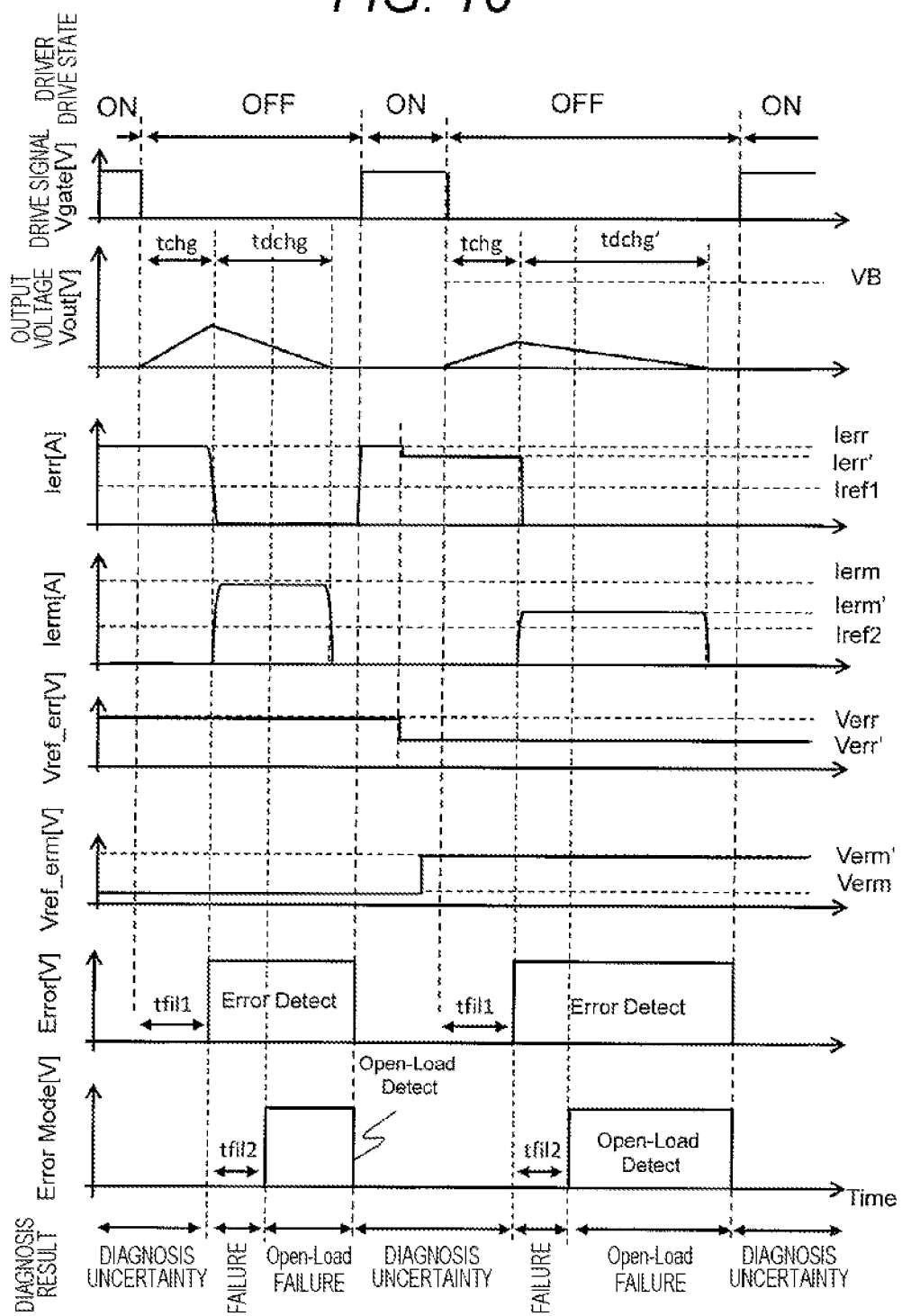
FIG. 16 is a time chart for describing an operation of changing constant currents Ierr and Ierm.

FIG. 16 is a time chart for describing an operation of changing constant currents Ierr and Ierm. If Vref_err decreases from Verr to Verr', Ierr decreases from Ierr to Ierr' by Vre_err/R1. If Vref_erm increases from Verm to Verm', Ierm decreases from Ierm to Ierm' by (VCC−Vref_erm)/R2.

By changing the drive currents of the constant current sources as such, an optimum current value of the diagnosis current can be selected according to conditions, and a charge/discharge time of the capacitor 1 can be controlled. For example, even in a case where a capacitance value of the capacitor 1 is small and the charge/discharge time of the capacitor 1 is too short depending on a magnitude of the diagnosis current to perform an accurate diagnosis, the accurate diagnosis becomes possible by decreasing the drive current and increasing the charge/discharge time.

Fourth Embodiment

In a fourth embodiment of the present invention, a configuration and an operation of the load drive device 100 capable of controlling filter times of filter circuits will be described. Portions changed from the second embodiment will hereinafter be mainly described with reference to FIGS. 9 to 14 of the second embodiment as appropriate.

Figure 17:
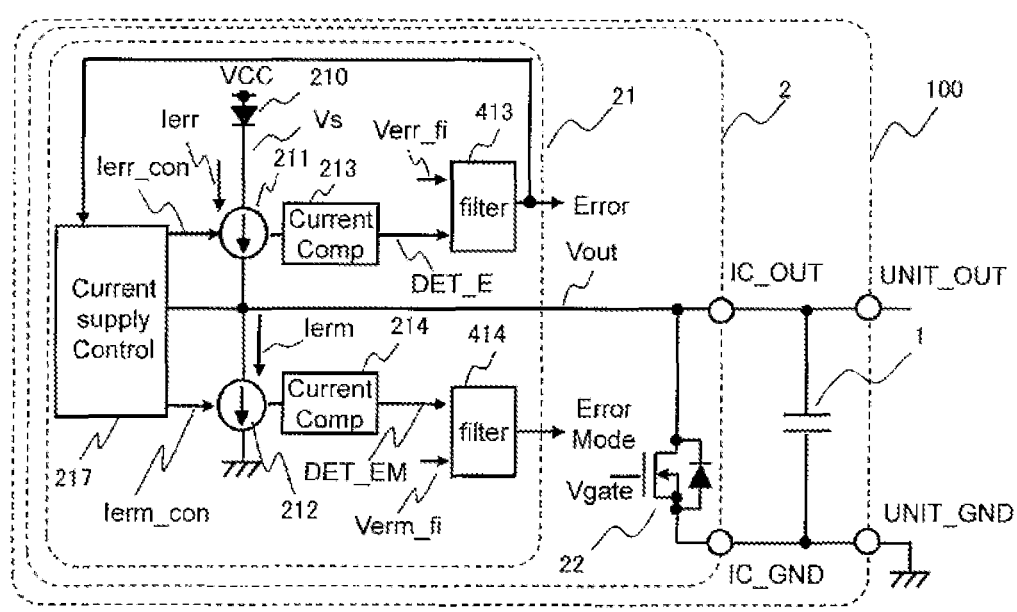
FIG. 17 is a block diagram illustrating a configuration of a load drive device 100 according to a fourth embodiment.

FIG. 17 is a block diagram illustrating a configuration of a load drive device 100 according to the fourth embodiment. Here, an example in which the filter circuits 215 and 216 described in the second embodiment are replaced with filter circuits 413 and 414, respectively, will be described. The filter circuit 413 receives a drive current detection signal DET_E and a filter time control signal Verr_fi as inputs. The filter circuit 414 receives a drive current detection signal DET_EM and a filter time control signal Verm_fi as inputs. The filter circuits 413 and 414 can switch filter times according to digital output high/low levels of the filter time control signals.

Figure 18:
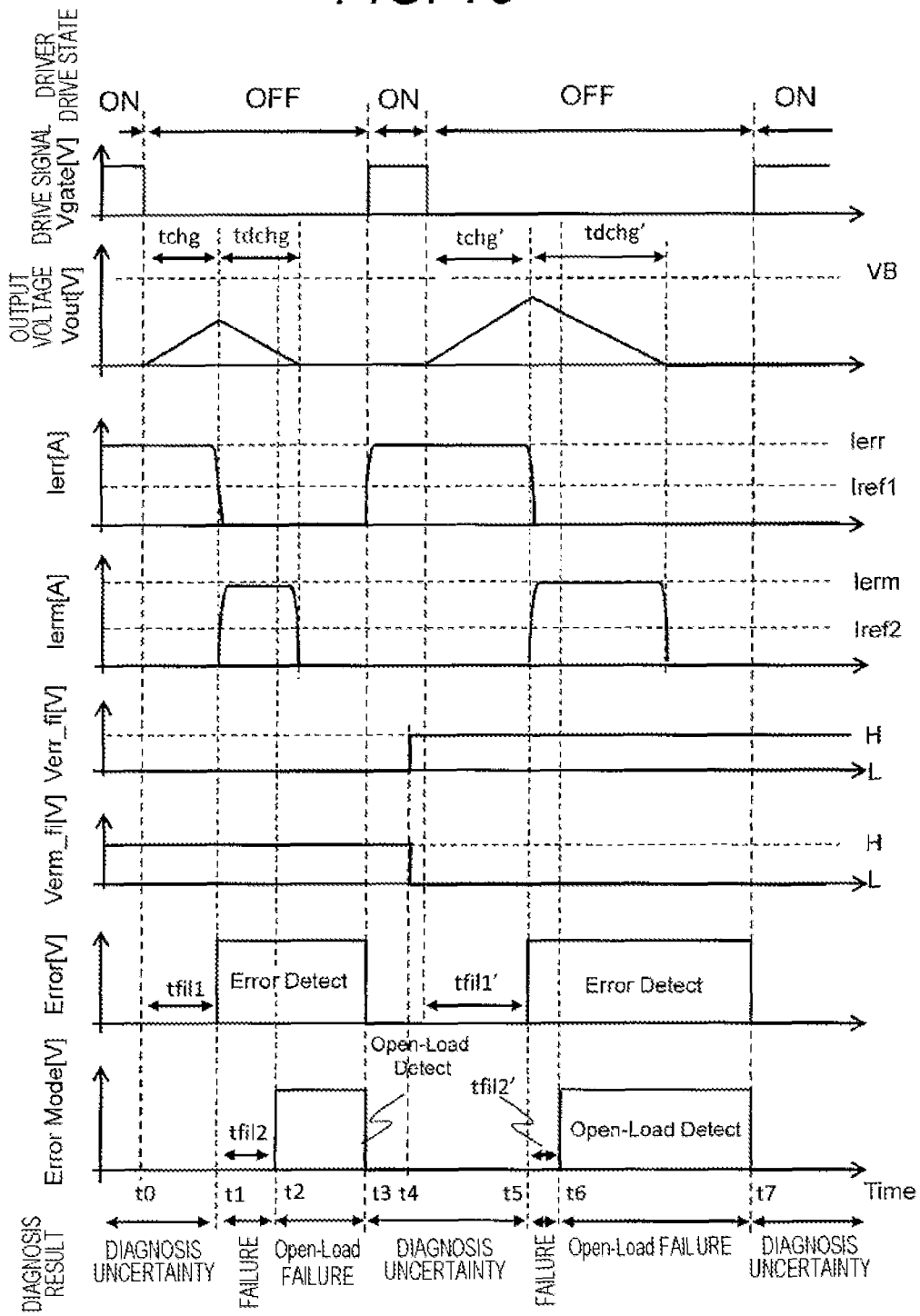
FIG. 18 is a timing chart for describing an operation of changing filter times.

FIG. 18 is a timing chart for describing an operation of changing filter times. A digital value of Verr_fi changes from a low level to a high level at a time t4, such that a filter time of failure current detection is switched from tfil1 to tfil1'. A digital value of Verm_fi changes from a high level to a low level at the time t4, a filter time of Ierm detection is switched from tfil2 to tfil2'. In the fourth embodiment, the filter circuits are configured by digital filters and switch the filter times tfil1 and tfil2 according to the digital signals, but can also be configured using analog filters. In this case, the filter times are continuously variably controlled by analog signals.

According to the fourth embodiment, an optimum filter time can be selected according to a condition. For example, in a case where a capacitance value of the capacitor 1 is small and a charge/discharge time of the capacitor 1 is shorter than the filter time, by setting the filter time to become shorter than the charge/discharge time, an accurate diagnosis can be performed even though the capacitance value of the capacitor 1 is small.

Fifth Embodiment

When a misfire failure has occurred in an internal combustion engine, there is a possibility that a three-way catalyst will be dissolved, and a prompt misfire diagnosis is thus required. In a fifth embodiment of the present invention, a configuration of a misfire diagnosis mechanism of an internal combustion engine capable of detecting a failure faster than a diagnosis manner using a conventional crank angle sensor by applying the load drive device 100 described in the second embodiment to a misfire diagnosis of the internal combustion engine will be described.

Figure 19:
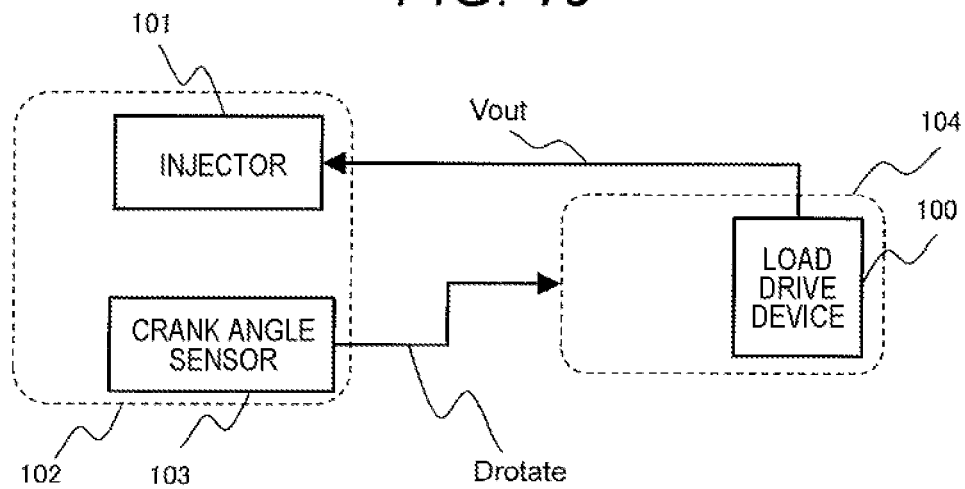
FIG. 19 is a block diagram of a misfire diagnosis mechanism of an engine according to a fifth embodiment.

FIG. 19 is a block diagram of a misfire diagnosis mechanism of an engine according to the fifth embodiment. The misfire diagnosis mechanism illustrated in FIG. 19 includes an internal combustion engine 102 and an engine control unit (ECU) 104. The internal combustion engine 102 includes an injector 101 and a crank angle sensor 103. The ECU 104 includes a load drive device 100. The crank angle sensor 103 outputs Drotate, which is data on the number of revolutions per unit time of the engine, to the ECU 104. The ECU 104 determines that a misfire has occurred if a value of Drotate falls below a threshold. That is, the ECU 104 diagnoses a misfire after the misfire has occurred inside the engine.

Meanwhile, the load drive device 100 described in the second embodiment can perform a diagnosis in a driver off period before driving the injector, and can thus diagnose a misfire before the misfire occurs inside the internal combustion engine 102. Therefore, the load drive device 100 may perform a failure diagnosis faster than a diagnosis method using the crank angle sensor 103. In addition, by combining a diagnosis mechanism by the conventional crank angle sensor 103 and a diagnosis mechanism by the load drive device 100 with each other, a dual system of an engine misfire diagnosis can be configured. Therefore, even though one of the diagnosis mechanisms cannot perform a diagnosis due to destruction or the like, the other of the diagnosis mechanisms can be used for a diagnosis, and reliability can thus be improved.

It has been described in the above description to use the load drive device 100 described in the second embodiment, but this is because it is preferable to diagnose a failure mode because it can be decided that an open failure is a misfire when the open failure has occurred at UNIT_OUT.

Therefore, a load drive device 100 according to any embodiment including an embodiment to be described later may be used as long as it can diagnose the failure mode.

Even in a case where the load drive device 100 detects only the presence or absence of a failure and cannot diagnose the failure mode, it is also possible to diagnose the failure mode by analyzing abnormal rotational behavior using a detection result of the crank angle sensor 103. Therefore, in that case, the load drive device 100 according to any of the first and subsequent embodiments may be used.

Sixth Embodiment

In a sixth embodiment of the present invention, a configuration example of a load drive device 100 in which the low-side drive circuit 22 described in the first embodiment is replaced with a high-side drive circuit 23 will be described. Also in the sixth embodiment, similar to the first embodiment, a configuration and an operation capable of rapidly and accurately diagnosing a UNIT_OUT terminal even in a configuration in which a capacitor 1 is connected between an output terminal and a ground terminal will be described. In the following description, portions changed from the first embodiment will hereinafter be mainly described with reference to FIGS. 3 to 8 as appropriate.

Figure 20:
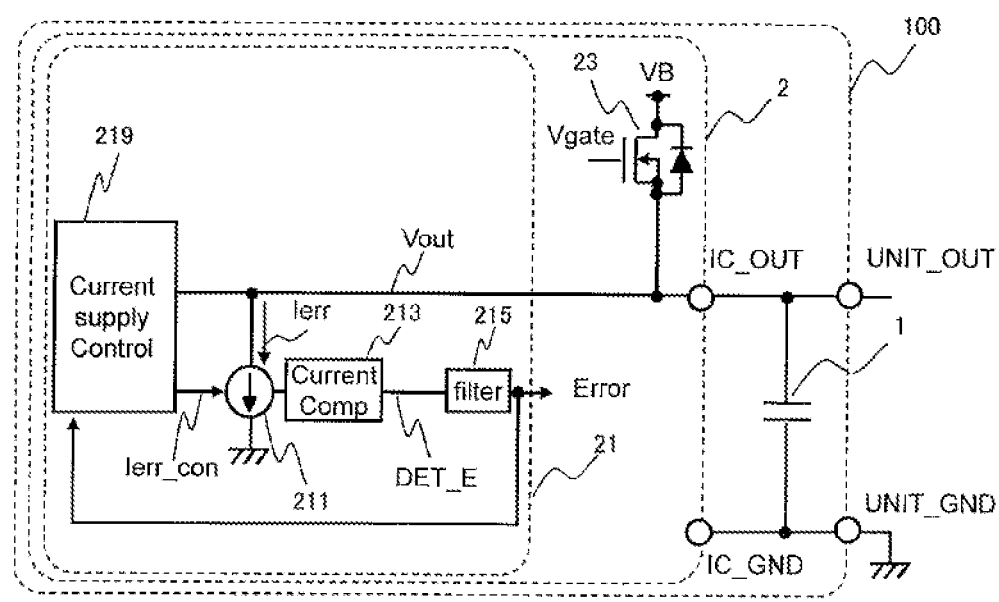
FIG. 20 is a block diagram illustrating a configuration of a load drive device 100 according to a sixth embodiment.

FIG. 20 is a block diagram illustrating a configuration of a load drive device 100 according to the sixth embodiment. In the load drive device 100 according to the sixth embodiment, the high-side drive circuit 23 is connected between a first power supply voltage VB and IC_OUT. A first constant current source 211 and a current comparison circuit 214 in a diagnosis circuit 21 can be configured by, for example, the circuit configuration illustrated in FIG. 10. The first constant current source 211 is connected between IC_OUT and a ground.

In order for the first constant current source 211 to make a drive current Ierr flow from an output terminal of IC_OUT to the ground, it is necessary to satisfy at least Equation 2. In a case of a normal operation, IC_OUT is connected to a ground potential via a load, such that Vgnd=Vout, and a relationship of Equation 2 is not satisfied. Therefore, Ierr does not become Iref2 or more and DET_E becomes a low level. If DET_E is at the low level continuously for a time of tfil2 or more, it is determined that a diagnosis result is normal.

In a case where a VB short-circuit failure has occurred at UNIT_OUT, IC_OUT is connected to the first power supply voltage VB, such that Vgnd<Vout (=VB). Because this satisfies Equation 2, Ierr becomes Iref2 or more, such that DET_E becomes a high level. If DET_E is at the high level continuously for a time of tfil2 or more, it is determined that the failure has occurred.

Figure 21:
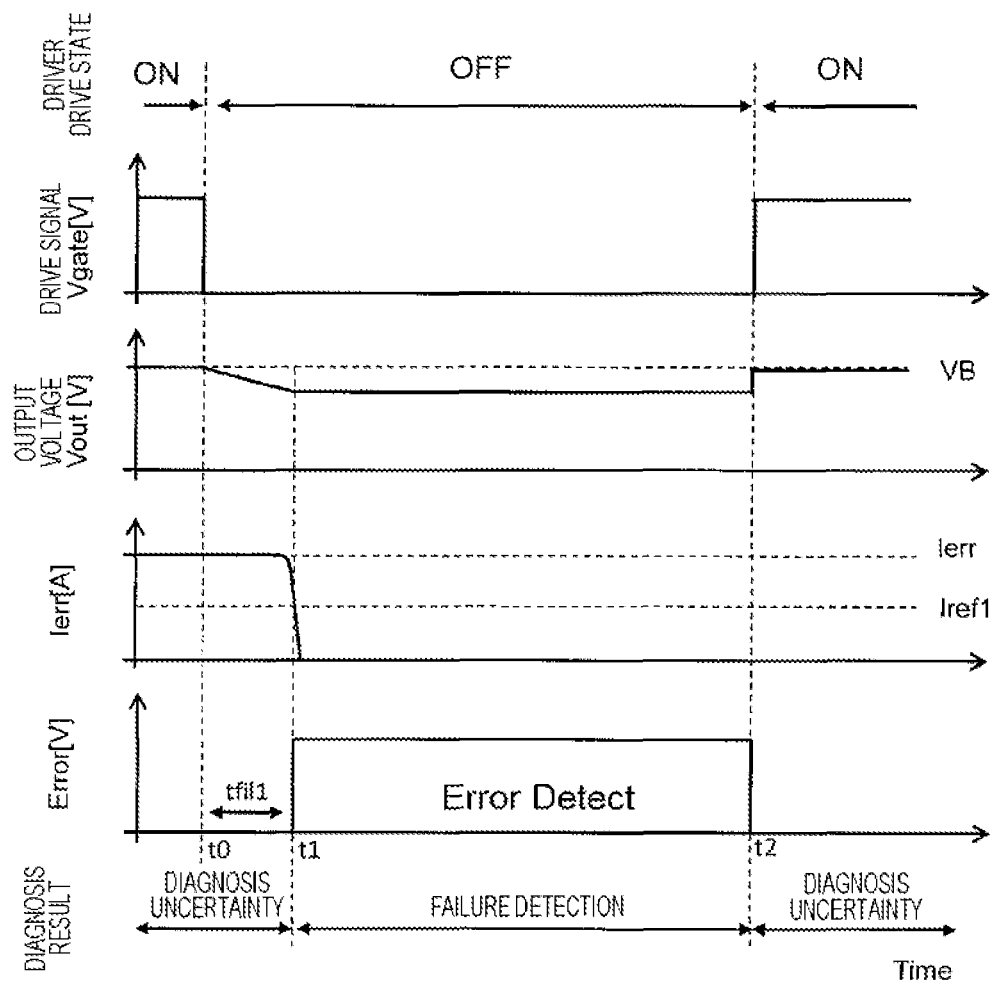
FIG. 21 is a timing chart for describing behavior of signals in each load state.

FIG. 21 is a timing chart for describing behavior of signals in each load state. In a case where an Open-Load failure has occurred at UNIT_OUT of the load drive device illustrated in FIG. 20, the capacitor 1 after the high-side drive circuit 23 is turned off is charged with electric charges of a VB level, such that Vgnd<Vout (=VB) and Equation 2 is satisfied. As a result, Ierr becomes Iref2 or more. When DET_E is at the high level continuously for a time of tfil or more, it is determined that the failure has occurred.

According to the sixth embodiment, in the configuration of the load drive device 100 in which the low-side drive circuit 22 in the first embodiment is replaced with the high-side drive circuit 23, even in a case where the capacitor 1 is connected between Vout and the ground, the UNIT_OUT terminal can be rapidly and accurately diagnosed to improve reliability.

Seventh Embodiment

In a seventh embodiment of the present invention, a configuration example of diagnosing a failure mode (any one of normal, an open-load failure, and a VB short-circuit failure) of the UNIT_OUT terminal in the configuration described in the sixth embodiment will be described. Portions changed from the sixth embodiment will hereinafter be mainly described with reference to the sixth embodiment as appropriate.

Figure 22:
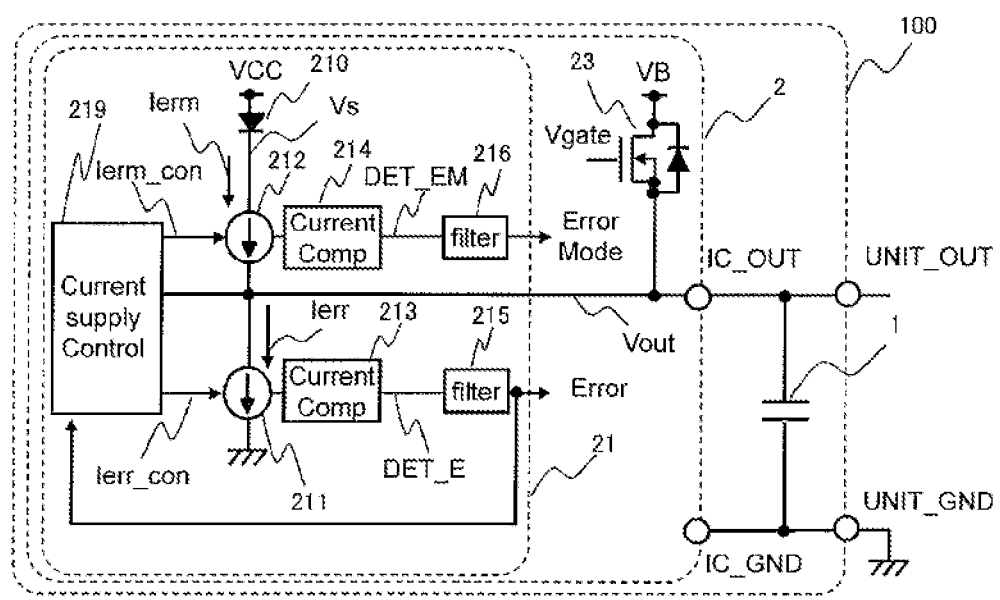
FIG. 22 is a block diagram illustrating a configuration of a load drive device 100 according to a seventh embodiment.

FIG. 22 is a block diagram illustrating a configuration of a load drive device 100 according to the seventh embodiment. A diagnosis circuit 21 illustrated in FIG. 22 includes a second constant current source 212, a current comparison circuit 214, and a filter circuit 216, in addition to the configuration described in the sixth embodiment. These configurations are the same as those described in the second embodiment, but the second constant current source 212 in the sixth embodiment is different from that of the second embodiment in that the second constant current source 212 is connected between a second power supply voltage VCC and an output terminal.

In order for the first constant current source 211 to make a drive current Ierr flow from the output terminal to the ground, it is necessary to satisfy at least Equation 2. In order for the second constant current source 212 to make a drive current Ierm flow from the second power supply voltage VCC to the output terminal, it is necessary to satisfy at least Equation 1.

In a case where a VB short-circuit failure has occurred at UNIT_OUT of the load drive device 100 illustrated in FIG. 22, Equation 2 is satisfied, and it is thus determined that the failure has occurred, and a diagnosis current is switched from Ierr to Ierm. At this time, because Equation 1 is not satisfied, in a case where DET_EM is at a low level continuously for a time of tfil2 or more, a diagnosis result is set to a VB short-circuit and a diagnosis flow ends.

Figure 23:
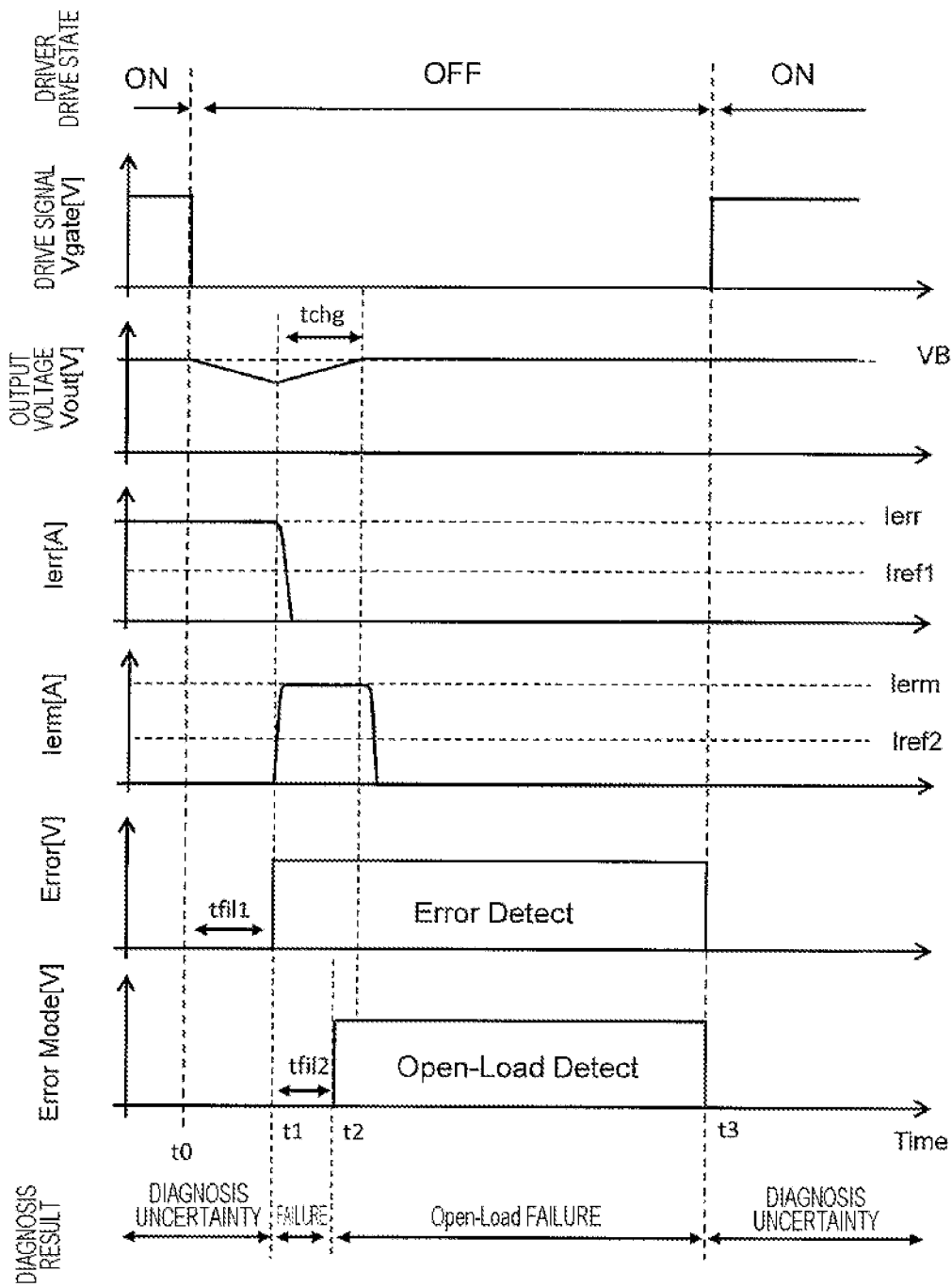
FIG. 23 is a time chart for describing a circuit operation in a case where an Open-Load failure has occurred at UNIT_OUT.

FIG. 23 is a time chart for describing a circuit operation in a case where an Open-Load failure has occurred at UNIT_OUT. A diagnosis flow is the same as that of FIG. 12. In a case where an Open-Load failure has occurred at UNIT_OUT of the load drive device 100 illustrated in FIG. 22, Equation 2 is satisfied, and it is thus determined that the failure has occurred, and a diagnosis current is switched from Ierr to Ierm, similar to the VB short-circuit detection processing.

When the Open-Load failure has occurred at UNIT_OUT, electric charges accumulated in a capacitor 1 are discharged at the time of driving the first constant current source 211, such that a potential Vout after a time tfil1 has elapsed can be expressed as Vout (=VB−Ierr×tfil1/C1)<VB using a capacitance value C1 of the capacitor 1. When the second constant current source 212 is driven after the time tfil1 has elapsed, Ierm is charged in the capacitor 1 and flows only until the charging is completed, and thus, DET_EM becomes a high level during this period. By setting tfil2 shorter than a charging time tchg of the capacitor 1, Ierm can be detected, such that the Open-Load failure can be determined.

According to the seventh embodiment, in addition to the configuration described in the sixth embodiment, a state (normal, the open-load failure, and the VB short failure) of UNIT_OUT can be detected. As a result, reliability of the load drive device 100 can be improved.

Eighth Embodiment

Figure 24:
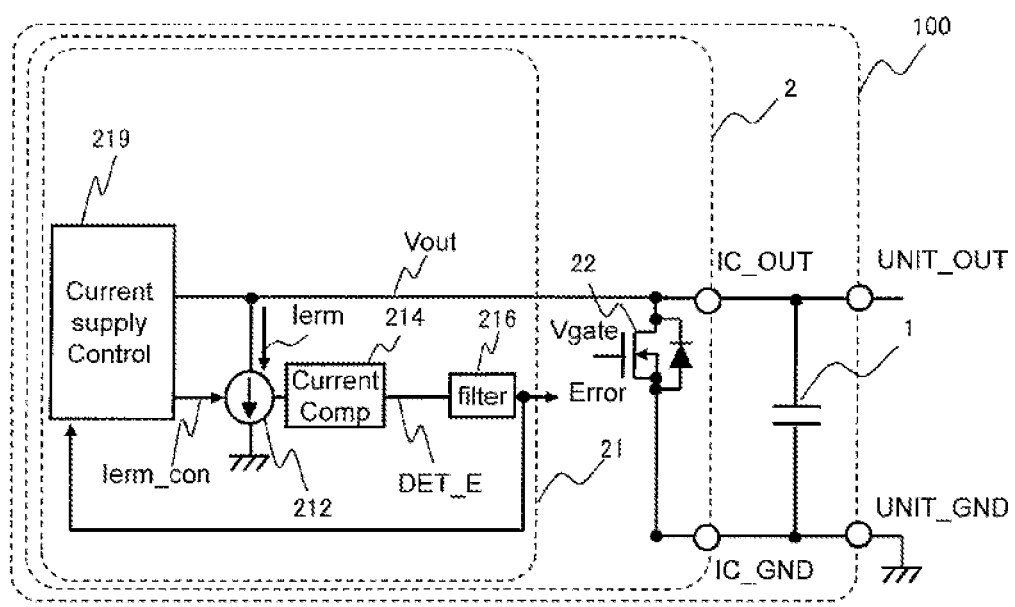
FIG. 24 is a block diagram illustrating a configuration of a load drive device 100 according to an eighth embodiment.

FIG. 24 is a block diagram illustrating a configuration of a load drive device 100 according to an eighth embodiment of the present invention. In the eighth embodiment, a configuration and an operation example assuming a case where an Open-Load failure of IC_OUT cannot be ignored will be described. The configuration illustrated in FIG. 24 includes a second constant current source 212, a current comparison circuit 214, and a filter circuit 216 instead of the first constant current source 211, the current comparison circuit 213, and the filter circuit 215 described in the first embodiment. These have the same configurations as those described in the second embodiment.

In the circuit configuration of FIG. 3 described in the first embodiment, because IC_OUT does not fail, a potential of UNIT_OUT becomes equal to VB at a normal time, and Ierr does not flow as long as VB>VCC. When Ierr flows, it means that VCC becomes larger than a potential of UNIT_OUT (that is, an open failure or a ground short-circuit failure). As a result, in the first embodiment, it is possible to distinguish between a case at a normal time and a case at a failure time according to the presence or absence of Ierr. On the other hand, in the eighth embodiment, IC_OUT may fail. If an open failure or a short-circuit failure has occurred at IC_OUT, a current does not flow to a capacitor 1, and thus, a diagnosis current (corresponding to Ierr in embodiment 1) does not flow. On the other hand, in the eighth embodiment, it is necessary to distinguish between a case at a normal time and a case at an abnormal time by making the diagnosis current flow at the normal time. That is, in the eighth embodiment, unlike the first embodiment, it is necessary to use a circuit configuration that makes the diagnosis current flow at the normal time. Therefore, in the eighth embodiment, in order to secure a path from VB to a ground at the normal time, a circuit configuration as illustrated in FIG. 24 has been adopted.

In the circuit configuration illustrated in FIG. 24, Ierm flows from VB to a ground at the normal time, and does not flow if an open failure has occurred at IC_OUT. Ierm does not flow even in a case of an open failure of UNIT_OUT, a ground short-circuit failure of UNIT_OUT, and a ground short-circuit failure of IC_OUT. Therefore, according to the circuit configuration of FIG. 24, even in a case where there is a possibility that the open failure will occur at IC_OUT, it is possible to distinguish between a case at the normal time and a case at the failure time according to the presence or absence of Ierm.

Figures 25, 26:
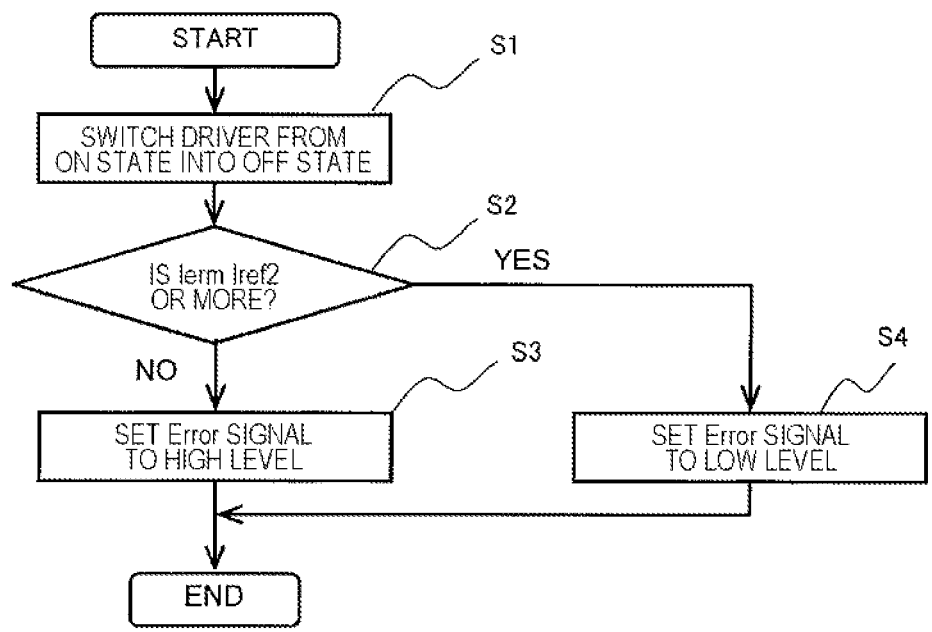
FIG. 25 is a flowchart for describing a procedure in which the load drive device 100 according to the eighth embodiment diagnoses UNIT_OUT.
FIG. 26 illustrates a correspondence table between a failure detection current and a diagnosis result.

FIG. 25 is a flowchart for describing a procedure in which the load drive device 100 according to the eighth embodiment diagnoses UNIT_OUT. Steps changed from the flowchart described in FIG. 6 will hereinafter be described.

S2: The current comparison circuit 214 monitors whether or not a drive current flowing to the first constant current source 211 is Iref2 or more after a filter time has elapsed since the low-side drive circuit 22 was turned off. In a case where the drive current flowing to the first constant current source 211 is Iref2 or more, the processing proceeds to S4, and in a case where the drive current flowing to the first constant current source 211 is less than Iref2, the processing proceeds to S3.

FIG. 26 illustrates a correspondence table between a failure detection current and a diagnosis result. In a case where the Open-Load failure has occurred at the UNIT_OUT terminal, the capacitor 1 after the low-side drive circuit 22 is turned off has no electric charge, such that the potential Vout is a ground potential and Equation 2 is not satisfied. Therefore, Ierm is less than Iref2 and DET_E becomes a low level. If DET_E is at the low level continuously for a time of tfil2 or more, it is determined that the failure has occurred.

In the correspondence table of FIG. 26, in a case where the Open-Load failure has occurred at the IC_OUT terminal, Ierm of Iref2 or more does not flow because there is no path making a current flow from IC_OUT, and DET_E becomes a low level. If DET_E is at the low level continuously for a time of tfil2 or more, it is determined that the failure has occurred.

According to the eighth embodiment, in the load drive device 100 of the first embodiment, even in a case where the Open-Load failure of the IC_OUT terminal cannot be ignored, a state (normal or a failure (including the Open-Load failure of the IC_OUT terminal)) of UNIT_OUT can be detected. As a result, reliability of the load drive device 100 can be improved.

Ninth Embodiment

In a ninth embodiment of the present invention, a configuration example of diagnosing a failure mode (any one of normal, an open-load failure, and a VB short-circuit failure) of the UNIT_OUT terminal in the configuration described in the eighth embodiment will be described. Portions changed from the eighth embodiment will hereinafter be mainly described with reference to the eighth embodiment as appropriate.

Figure 27:
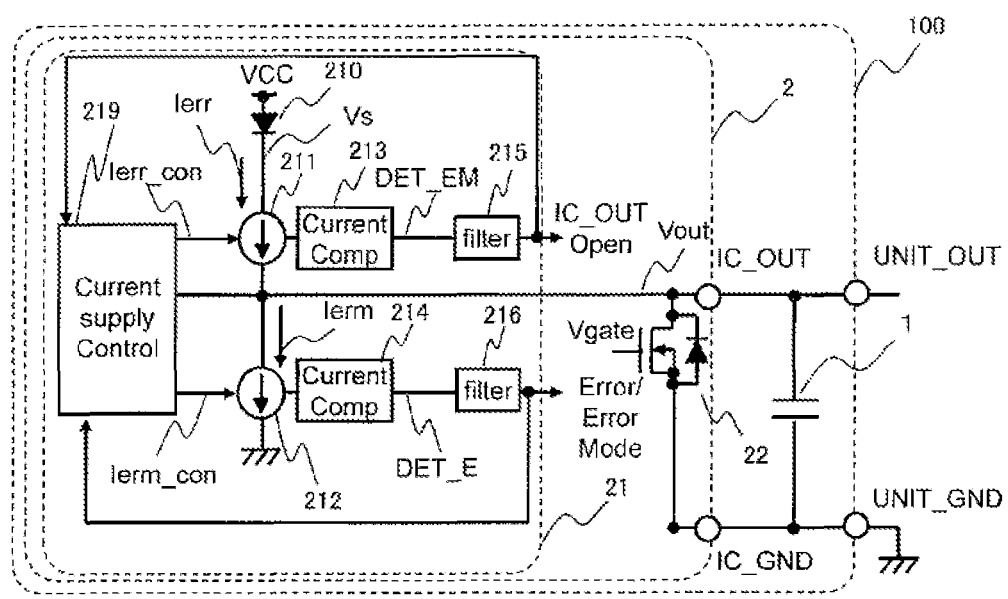
FIG. 27 is a block diagram illustrating a configuration of a load drive device 100 according to an ninth embodiment.

FIG. 27 is a block diagram illustrating a configuration of a load drive device 100 according to the eighth embodiment. A diagnosis circuit 21 illustrated in FIG. 27 includes a first constant current source 211, a current comparison circuit 213, and a filter circuit 215, in addition to the configuration described in the eighth embodiment. These configurations are similar to those described in the first embodiment.

Figure 28:
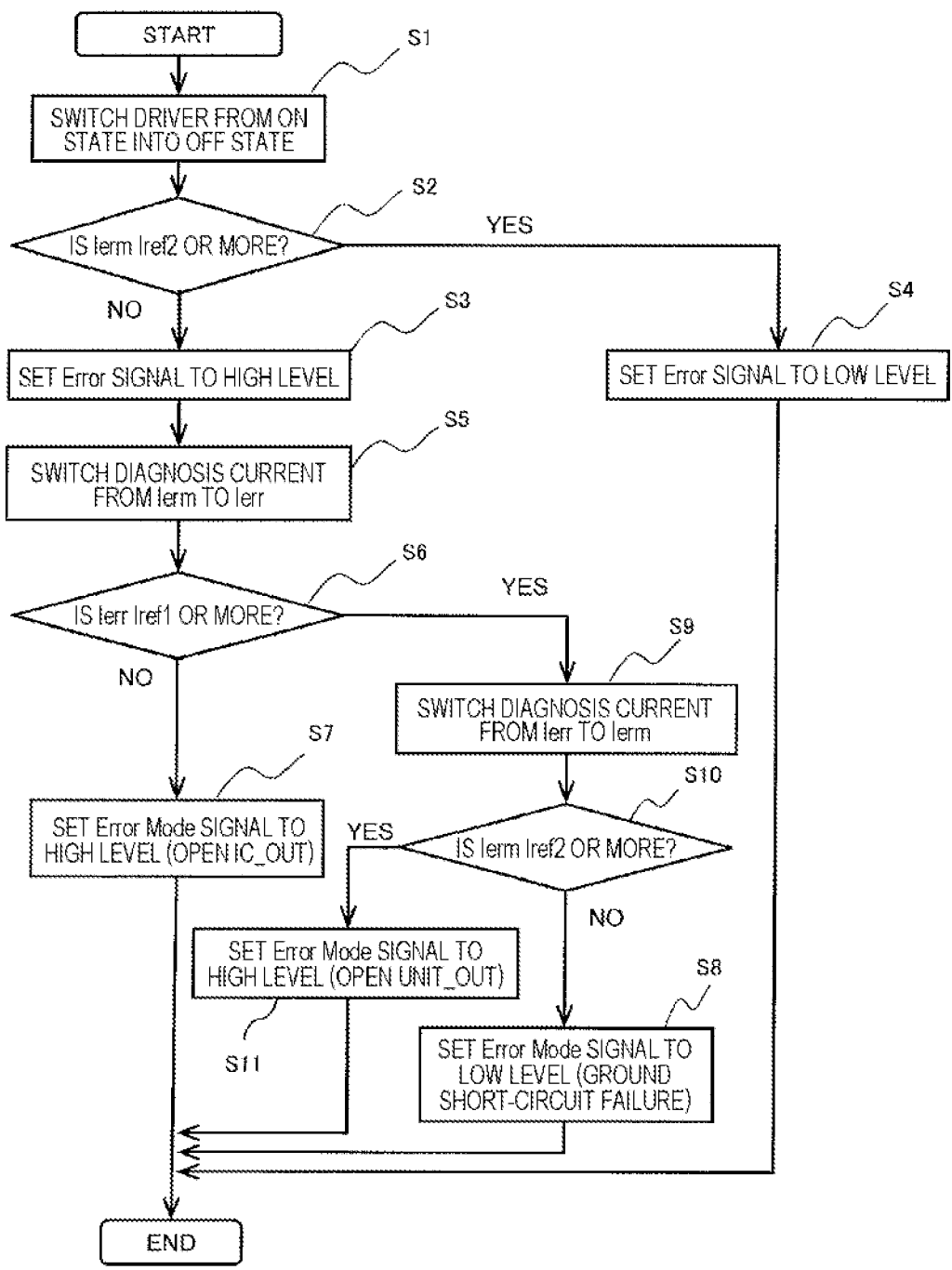
FIG. 28 is a flowchart for describing a procedure in which the load drive device 100 according to the ninth embodiment diagnoses UNIT_OUT.

FIG. 28 is a flowchart for describing a procedure in which the load drive device 100 according to the ninth embodiment diagnoses UNIT_OUT. Steps changed from the flowchart described in FIG. 12 will hereinafter be described.

S2: The current comparison circuit 214 monitors whether or not a drive current flowing to the second constant current source 212 is Iref2 or more after tfil2 has elapsed since the low-side drive circuit 22 was turned off In a case where the drive current flowing to the second constant current source 212 is Iref2 or more, the processing proceeds to S4, and in a case where the drive current flowing to the second constant current source 212 is less than Iref2, the processing proceeds to S3. In a case where Ierm is less than Iref2 ($\approx$ does not flow), it means that any failure occurs at UNIT_OUT or IC_OUT. The present step has the significance of detecting any failure as a first step.

S6: The current comparison circuit 213 monitors whether or not a drive current flowing to the first constant current source 211 is Iref1 or more after a time tfil1 has elapsed since the first constant current source 211 was driven. In a case where the drive current flowing to the first constant current source 211 is Iref1 or more, the processing proceeds to S9, and in a case where the drive current flowing to the first constant current source 211 is less than Iref2, the processing proceeds to S7.

S6: Supplement: (a) if UNIT_OUT is open, Ierr flows through the capacitor 1, (b) if UNIT_OUT is a ground short-circuited, Ierr flows toward the ground, and (c) if IC_OUT is ground short-circuited, Ierr flows toward the ground. Therefore, if Ierr does not flow in S6 in the present step (S6: NO), it means that IC_OUT is open. Therefore, the present step has the significance of determining whether IC_OUT is open or not.

S9: The first constant current source 211 is turned off and the second constant current source 212 is turned on.

S10: The current comparison circuit 214 monitors whether or not a drive current flowing to the second constant current source 212 is Iref2 or more after a time tfil2 has elapsed since the second constant current source 212 was driven in S9. In a case where the drive current flowing to the second constant current source 212 is Iref2 or more, the processing proceeds to S11, and in a case where the drive current flowing to the second constant current source 212 is less than Iref2, the processing proceeds to S8.

S10: Supplement: If Ierm flows in the present step (S10: YES), it means that UNIT_OUT is open and Ierm is flowing from the capacitor 1. Therefore, in S11, a diagnosis result indicating such a situation is output. If Ierm does not flow in this step (S10: NO), it means that UNIT_OUT or IC_OUT is ground short-circuited. However, it is not possible to distinguish which of UNIT_OUT or IC_OUT is ground short-circuited.

FIG. 29 illustrates a correspondence table between a failure detection current and a diagnosis result. First, as a failure diagnosis, if Ierm is Iref2 or higher, it is diagnosed that UNIT_OUT is normal. In a case where Ierm is less than Iref2, a diagnosis current is switched from Ierm to Ierr and the processing proceeds to a failure mode diagnosis. Further, Ierr and Iref1 or Ierm and Iref2 are compared with each other, and a failure mode is diagnosed on the basis of a comparison result.

Figure 30:
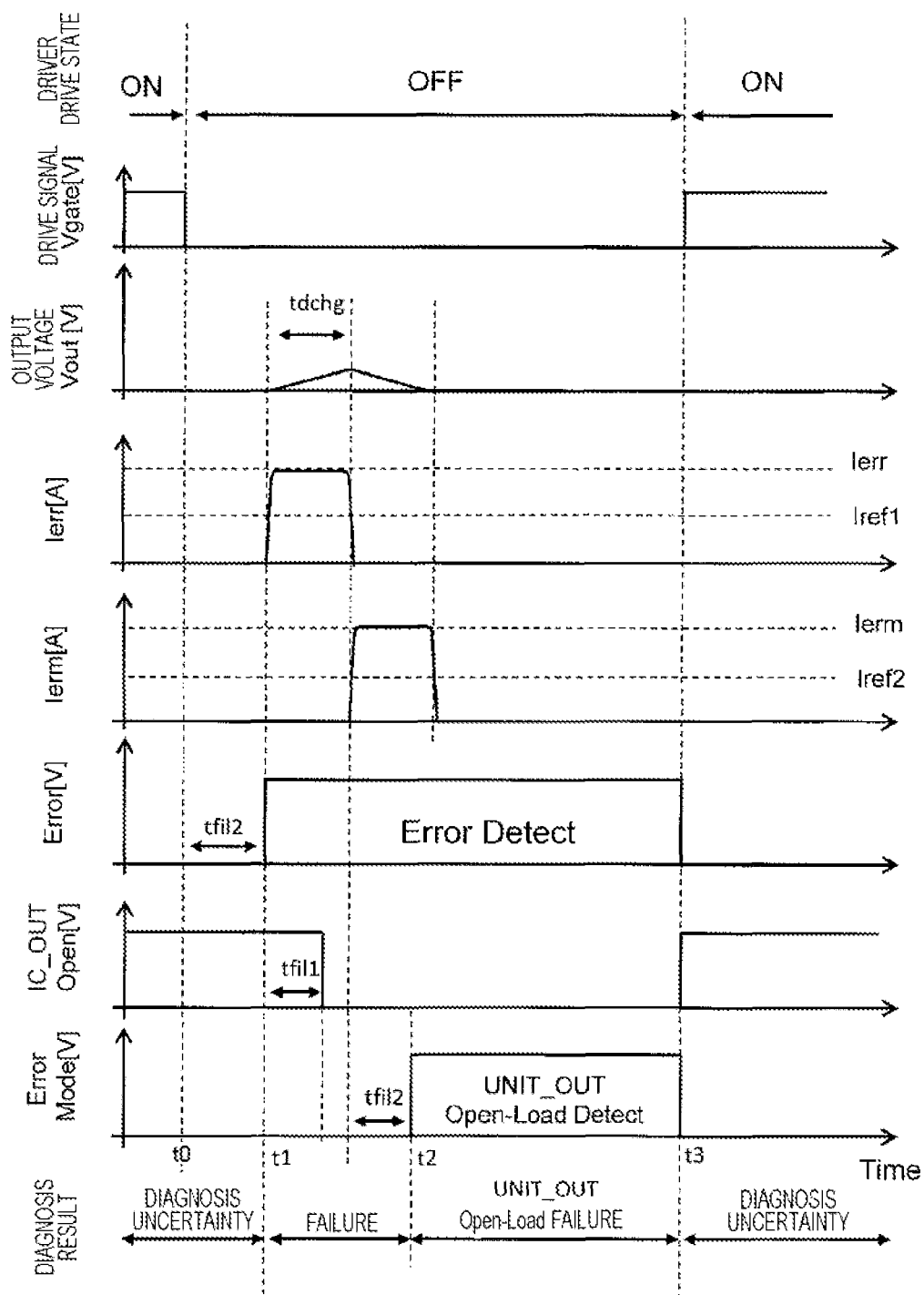
FIG. 30 is a timing chart for describing an operation in a case where an Open-Load failure has occurred at UNIT_OUT in the correspondence table of FIG. 29.

FIG. 30 is a timing chart for describing an operation in a case where an Open-Load failure has occurred at UNIT_OUT in the correspondence table of FIG. 29. In a case where the Open-Load failure has occurred at the UNIT_OUT terminal, the capacitor 1 after the low-side drive circuit 22 is turned off has no electric charge, such that the potential Vout is a ground potential and Equation 2 is not satisfied. Therefore, Ierm is less than Iref2 and DET_E becomes a low level. In a case where DET_E is at the low level continuously for a time of tfil2 or more, it is determined that the failure has occurred. An error signal is input to a constant current source control circuit 219, a current is switched from Ierm to Ierr, and a diagnosis by the current Ierr is performed.

When the Open-Load failure has occurred at UNIT_OUT, Equation 1 is satisfied, such that Ierr of Iref1 or more flows to the capacitor 1 and DET_EM becomes a high level. If DET_EM is at the high level for a time tfil1 or more, IC_OUT Open becomes low, such that it is determined that the Open-Load failure is not an Open-Load failure of IC_OUT. Next, an IC_OUT Open signal is input to the constant current source control circuit 219, a drive current is switched from Ierr to Ierm, and a diagnosis by the current Ierm is performed. A potential is generated in the capacitor 1 by electric charges charged in the capacitor 1 by Ierr and Equation 2 is satisfied, such that Ierm of Iref2 or more flows and DET_EM becomes a high level. If DET_EM is at the high level continuously for a time of tfil2 or more, it is determined that the Open-Load failure has occurred.

According to the ninth embodiment, in the load drive device 100 illustrated in the first embodiment, even in a case where the Open-Load failure of the IC_OUT terminal cannot be ignored, a state (normal, an Open-Load failure of IC_OUT, an Open-Load failure of UNIT_OUT, or a Short-to-GND failure)) of a drive circuit terminal destination can be determined. As a result, reliability of the load drive device 100 can be improved.

Tenth Embodiment

In the second embodiment, in addition to the failure diagnosis in the first embodiment, the configuration example of diagnosing the failure mode using Ierm has been described. In a tenth embodiment of the present invention, a configuration example of diagnosing a failure mode using a potential Vout of the IC_OUT terminal instead of Ierm will be described. However, portions changed from the first embodiment will hereinafter be mainly described with reference to FIGS. 3 to 8 as appropriate.

Figure 31:
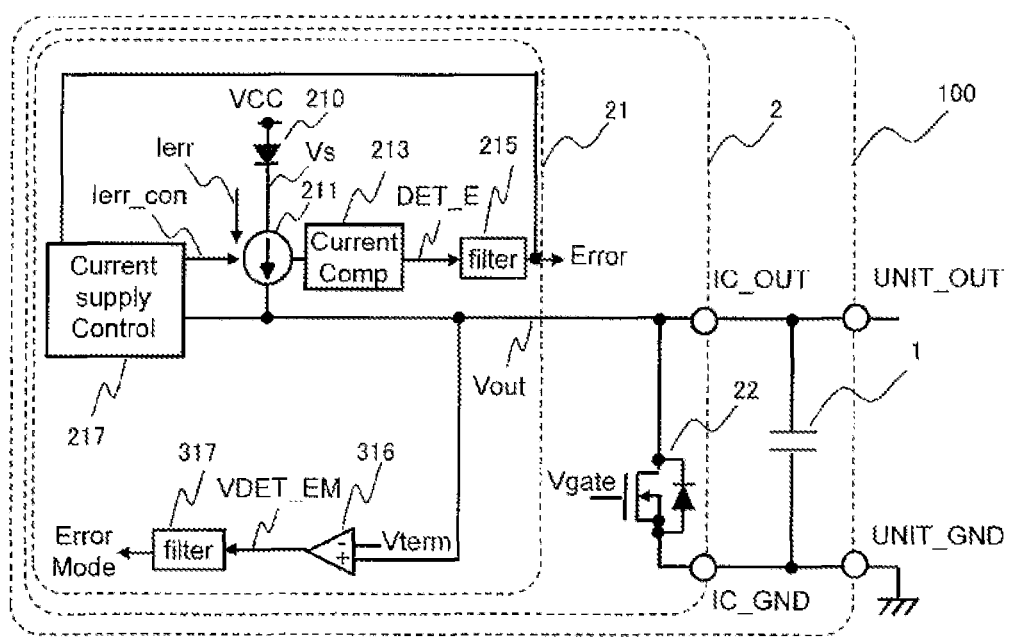
FIG. 31 is a block diagram illustrating a configuration of a load drive device 100 according to a tenth embodiment.

FIG. 31 is a block diagram illustrating a configuration of a load drive device 100 according to the tenth embodiment.

A diagnosis circuit 21 illustrated in FIG. 31 includes a voltage comparison circuit 316 and a filter circuit 317, in addition to the configuration described in the first embodiment. The voltage comparison circuit 316 compares the potential Vout of the IC_OUT terminal with a failure mode detection threshold voltage Vterm. The filter circuit 317 takes an output voltage detection signal VDET_EM, which is an output of the voltage comparison circuit 316, as an input. A filter time of the filter circuit 317 is tfil2.

Figures 32, 33:
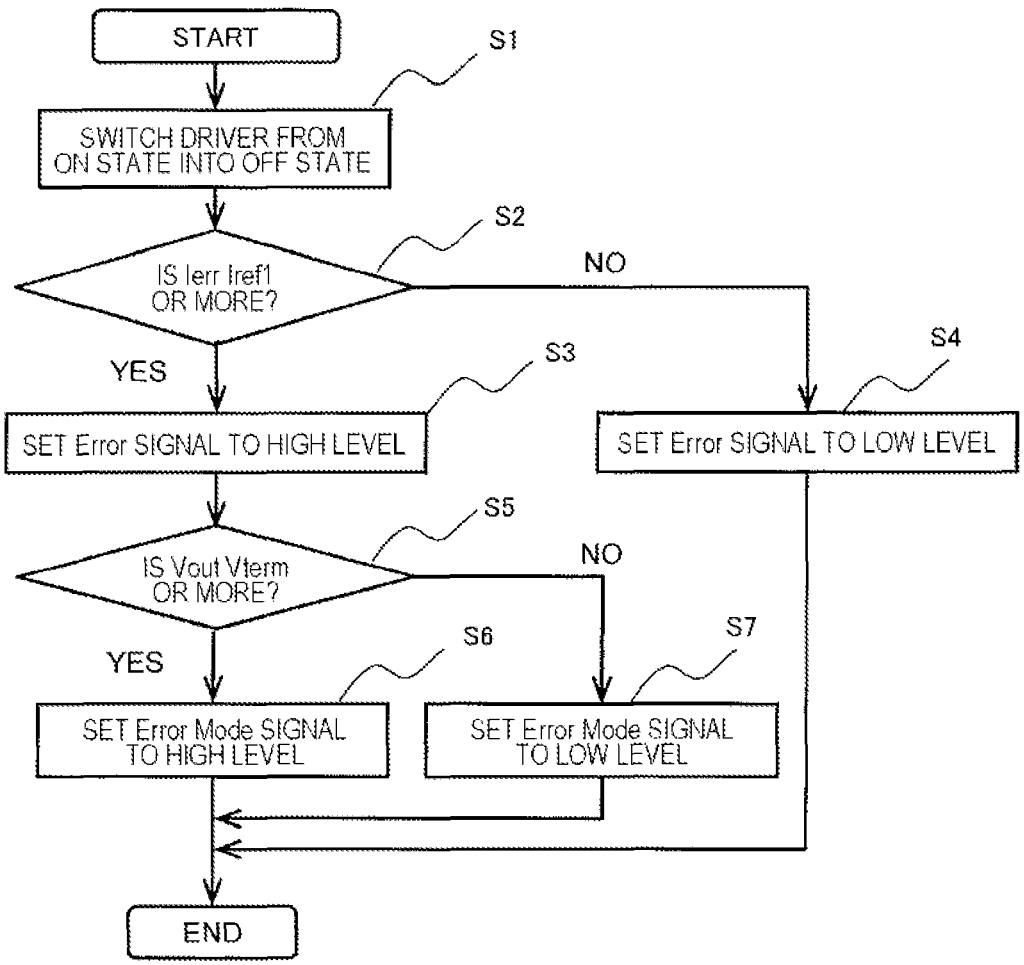
FIG. 32 is a flowchart for describing a procedure in which the load drive device 100 according to the tenth embodiment diagnoses UNIT_OUT.
FIG. 33 illustrates a correspondence table between a failure detection current and an output voltage, and a diagnosis result.

FIG. 32 is a flowchart for describing a procedure in which the load drive device 100 according to the tenth embodiment diagnoses UNIT_OUT. Steps changed from the flowchart described in FIG. 6 will hereinafter be described.

S3: The current comparison circuit 213 sets an error signal, which is a failure detection signal, to a high level, and ends the processing.

S5: The voltage comparison circuit 316 determines whether or not the potential Vout is Vterm or more at a point in time when tfil2 has elapsed since the error signal becomes the high level. In a case where Vout is Vterm or more, the processing proceeds to S6, and in a case where Vout is less than Vterm, the processing proceeds to S7.

S6: The filter circuit 317 sets an error mode signal, which is a failure mode discrimination signal, to a high level, and ends the processing.

S7: The filter circuit 317 sets the error mode signal to a low level and ends the processing.

FIG. 33 illustrates a correspondence table between a failure detection current and an output voltage, and a diagnosis result. If Ierr is less than Iref1, it is diagnosed that UNIT_OUT is normal. In a case where Ierr is Iref1 or more, it is determined that the failure has occurred and Vout is monitored. Vout is compared with Vterm, and the failure mode is diagnosed on the basis of a comparison result.

Figure 34:
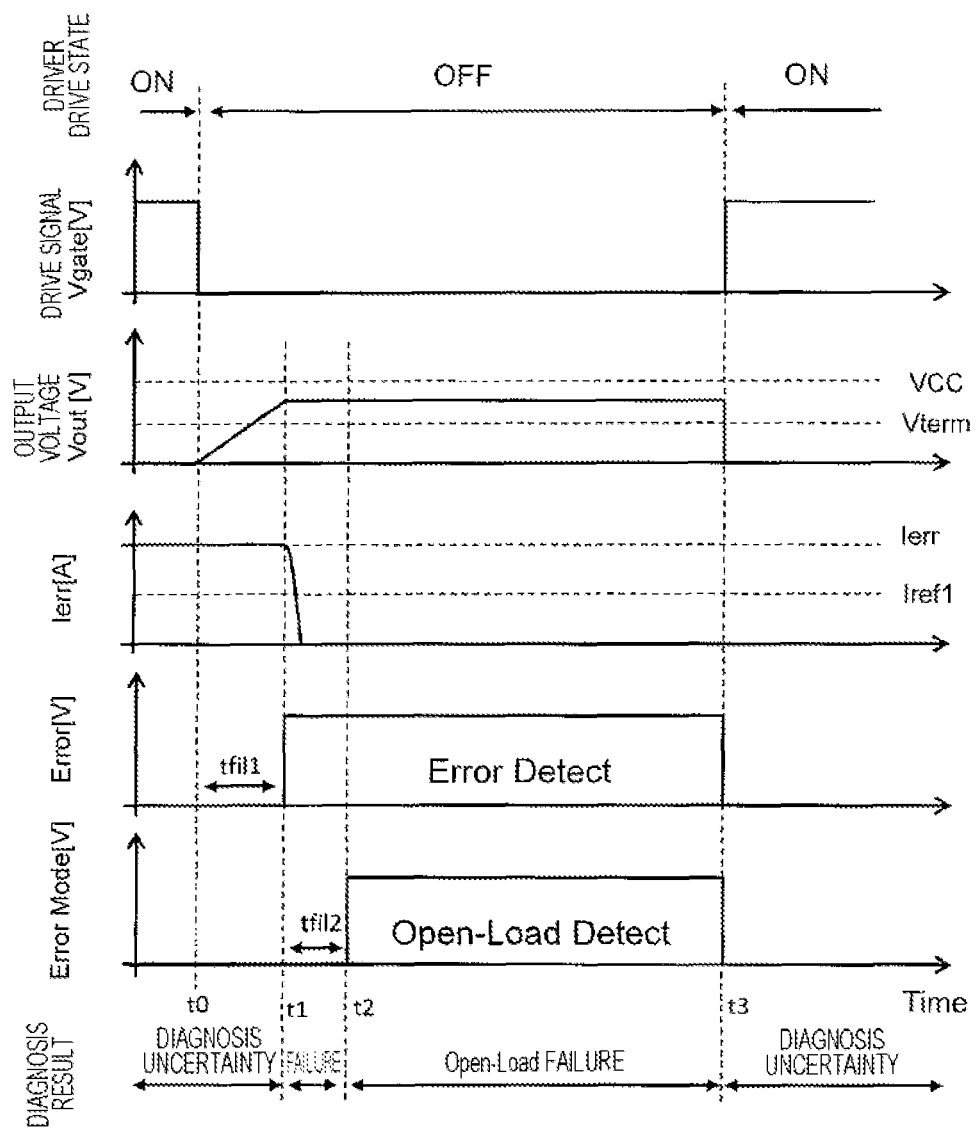
FIG. 34 is a timing chart for describing a circuit operation in a case where an Open-Load failure has occurred at UNIT_OUT.

FIG. 34 is a timing chart for describing a circuit operation in a case where an Open-Load failure has occurred at UNIT_OUT. In a case where the Open-Load failure has occurred at UNIT_OUT, Equation 1 is satisfied, and it is thus determined that the failure has occurred. When the Open-Load failure has occurred at UNIT_OUT, Ierr is charged in the capacitor 1, and the potential Vout after the time tfil1 can be expressed as Vterm<Vout (=Ierr×tfil1/C1) using a capacitance value C1 of the capacitor 1. If Vout is monitored by the voltage comparison circuit 316 after the time tfil1, a potential of Vterm or more is detected, and thus, VDET_EM, which is the output voltage detection signal, becomes a high level during this period. If VDET_EM is at the high level continuously for tfil2 or more, it is determined that the Open-Load failure has occurred.

In a case where a Short-to-GND failure has occurred at UNIT_OUT, Equation 1 is satisfied, and it is thus determined that the failure has occurred. After the time tfil1, the voltage Vout is monitored by the voltage comparison circuit 316. When UNIT_OUT is ground short-circuited, the capacitor 1 is not charged with electric charges. Therefore, the potential Vout after time tfil1 satisfies Equation: Vout=Vgnd<Vterm, to become smaller than Vterm. Therefore, VDET_EM becomes a low level. If VDET_EM is at the low level continuously for tfil2 or more, it is determined that the Short-to-Ground failure has occurred.

According to the tenth embodiment, by using Vout instead of Ierm, UNIT_OUT can be diagnosed at a high speed and the failure mode can be determined at a high speed, similar to the second embodiment.

Modifications of the Present Invention

The present invention is not limited to the above embodiments, and includes various modifications. For example, the above embodiments have been described in detail in order to describe the present invention in an easy-to-understand manner, and are not necessarily limited to including all the components described. In addition, some of components of a certain embodiment can be replaced by components of another embodiment, and components of another embodiment can also be added to components of a certain embodiment. In addition, it is possible to add, delete, and replace other components with respect to some of the components of the respective embodiments. In addition, control lines or signal lines considered to be necessary for the description are illustrated, and all control lines or signal lines are not necessarily illustrated for a product.

For example, in the configuration using the high-side drive circuit 23 described in the sixth to seventh embodiments, a configuration for changing the drive current value described in the third embodiment and a configuration for changing the filter time described in the fourth embodiment can be adopted.

REFERENCE SIGNS LIST

1 capacitor
2 drive circuit
3 microcontroller
4 communication interface (I/F)
5 CPU
6 gate drive circuit
21 diagnosis circuit
22 low-side drive circuit
23 high-side drive circuit
100 load drive device
101 injector
102 internal combustion engine
103 crank angle sensor
104 engine control unit (ECU)

210 reverse current prevention diode
211 first constant current source
212 second constant current source
213, 214 current comparison circuit
215, 216 filter circuit
217 constant current source control circuit
221 input synchronization unit
222 glitch filter
223 flip flop
224 NOR
225 NAND
226 AND
227 NOT
228 buffer circuit
231 operational amplifier
232 NMOS
233 PMOS
311, 312 voltage comparison circuit
315 voltage dividing circuit
316 voltage comparison circuit
317 filter circuit
411, 412 drive current control circuit
413, 414 filter circuit
VB first power supply voltage
VCC second power supply voltage
Ierr_con, Ierm_con constant current source control signal

The invention claimed is:

1. A load drive device comprising:
a low-side driver which drives an inductive load;
a gate drive circuit which performs drive control of the low-side driver;
an inter-terminal capacitor which is provided between a ground terminal and a load terminal; and
a diagnosis circuit which detects the presence or absence of a failure of the load terminal by a value of a current flowing between an internal power supply and an output terminal of the low-side driver when the low-side driver is in an off state.

2. The load drive device according to claim 1, wherein the diagnosis circuit is configured to specify a failure mode indicating whether the failure is an open failure or a ground short-circuit failure, by a voltage value of the inter-terminal capacitor or a current value flowing between the output terminal of the low-side driver and a ground.

3. The load drive device according to claim 2, wherein the diagnosis circuit is configured to determine the ground short-circuit failure and the open failure of the inductive load on the basis of a comparison result between a current value and a predetermined threshold current in a case where the failure mode is specified by the current.

4. The load drive device according to claim 1, wherein the diagnosis circuit that detects the presence or absence of the failure of the load terminal includes:
a second power supply which supplies a second voltage lower than a first voltage of a first power supply connected to the inductive load;
a first constant current source which receives the supply of the second voltage and outputs a first constant current to the load terminal; and
a first comparison circuit which outputs an error signal indicating that the load terminal has failed when the first constant current is larger than a first determination threshold.

5. The load drive device according to claim 4, further comprising a failure mode diagnosis circuit which determines whether the failure is a ground short-circuit failure or an open failure when the failure has occurred at the load terminal,
wherein the failure mode diagnosis circuit includes:
a second constant current source which is connected between the load terminal and a ground and outputs a second constant current; and
a second comparison circuit which outputs a diagnosis result indicating that the ground short-circuit failure has occurred when the second constant current is less than a second determination threshold and outputs a diagnosis result indicating that the open failure has occurred when the second constant current is the second determination threshold or more.

6. The load drive device according to claim 1, wherein the diagnosis circuit is configured to output the current between the internal power supply and the output terminal of the low-side driver,
the load drive device further comprises a control circuit which outputs a current control signal indicating a value of the current output by the diagnosis circuit, and
the diagnosis circuit outputs the current having a current value indicated by the current control signal.

7. The load drive device according to claim 1, further comprising a diagnosis filter circuit which outputs a filtered diagnosis result indicating that the load terminal has failed when the diagnosis circuit has continuously outputted a diagnosis result indicating that the load terminal has failed for a predetermined time or more and does not output the filtered diagnosis result indicating that the load terminal has failed when the diagnosis circuit has continuously outputted the diagnosis result indicating that the load terminal has failed for a time less than the predetermined time,
wherein the diagnosis circuit outputs the output of the diagnosis filter circuit as a final diagnosis result of the load terminal.

8. The load drive device according to claim 7, further comprising a control circuit which outputs a filter control signal indicating the predetermined time,
wherein the diagnosis filter circuit outputs the filtered diagnosis result according to the filter control signal.

9. The load drive device according to claim 1, wherein the inter-terminal capacitor is connected between the output terminal of the low-side driver and the load terminal,
the load drive device further comprises a second diagnosis circuit which determines whether or not a failure has occurred at the output terminal of the low-side driver, and
the second diagnosis circuit includes:
a second constant current source which makes a second constant current flow between the output terminal of the low-side driver and a ground; and
a second comparison circuit which outputs an error signal indicating that the output terminal of the low-side driver or the load terminal has failed when the second constant current is less than a second determination threshold.

10. The load drive device according to claim 9, wherein the diagnosis circuit that detects the presence or absence of the failure of the load terminal includes:
a second power supply which supplies a second voltage lower than a first voltage of a first power supply connected to the inductive load;
a first constant current source which is connected to the second constant current source in series, receives the supply of the second voltage, and outputs a first constant current to the load terminal; and a first comparison circuit which outputs an error signal indicating that the load terminal has failed by comparing the first constant current with a first determination threshold, the load drive device further comprises a control circuit which turns on or off the first constant current source and the second constant current source, respectively, the control circuit switches the second constant current source into an off state and turns on the first constant current source in a case where the second constant current is less than the second determination threshold when the control circuit turns off the first constant current source and turns on the second constant current source, the first comparison circuit outputs an error signal indicating that an open failure has occurred at the output terminal of the low-side driver when the first constant current is less than the first determination threshold, the control circuit switches the first constant current source into an off state and turns on the second constant current source in a case where the first constant current is the first determination threshold or more when the control circuit turns on the first constant current source and turns off the second constant current source, the second comparison circuit outputs an error signal indicating that an open failure has occurred at the load terminal in a case where the second constant current is the second determination threshold or more when the first constant current source has been switched into the off state and the second constant current source has been turned on, and the second comparison circuit outputs an error signal indicating that a ground short-circuit failure has occurred at the output terminal of the low-side driver or the load terminal in a case where the second constant current is less than the second determination threshold when the first constant current source has been switched into the off state and the second constant current source has been turned on.

11. An engine system comprising:
a crank angle sensor which monitors the number of revolutions of an engine;
a misfire diagnosis mechanism which detects a misfire of the engine on the basis of a value of the number of revolutions detected by the crank angle sensor; and
the load drive device according to claim 1,
wherein the load drive device drives an injector that ignites the engine, as the inductive load.

\* \* \* \* \*